United States Patent
Kim et al.

(10) Patent No.: US 10,916,582 B2
(45) Date of Patent: Feb. 9, 2021

(54) VERTICALLY-STRAINED SILICON DEVICE FOR USE WITH A PERPENDICULAR MAGNETIC TUNNEL JUNCTION (PMTJ)

(71) Applicant: Spin Memory, Inc., Fremont, CA (US)

(72) Inventors: Kuk-Hwan Kim, San Jose, CA (US); Dafna Beery, Palo Alto, CA (US); Amitay Levi, Cupertino, CA (US); Andrew J. Walker, Mountain View, CA (US)

(73) Assignee: SPIN MEMORY, INC., Fremont, CA (US)

( * ) Notice: Subject to any disclaimer, the term of this patent is extended or adjusted under 35 U.S.C. 154(b) by 96 days.

(21) Appl. No.: 15/859,453

(22) Filed: Dec. 30, 2017

(65) Prior Publication Data

US 2019/0206940 A1 Jul. 4, 2019

(51) Int. Cl.
*H01L 27/22* (2006.01)
*H01L 21/28* (2006.01)
(Continued)

(52) U.S. Cl.
CPC .......... *H01L 27/228* (2013.01); *G11C 11/161* (2013.01); *H01F 10/329* (2013.01);
(Continued)

(58) Field of Classification Search
CPC .............. H01L 27/228; H01L 27/2454; H01L 23/5283; H01L 23/3065; H01L 43/08; H01L 43/02; H01L 43/12; H01L 29/7827; H01L 21/823487; H01L 21/823885; G11C 11/161; H01F 10/3286
See application file for complete search history.

(56) References Cited

U.S. PATENT DOCUMENTS 4,267,013 A    5/1981   Iida et al.
4,855,015 A *  8/1989   Douglas ............. H01L 21/3065
                                                     438/9
(Continued)

OTHER PUBLICATIONS

Nagata et al. "Downstream etching of Si and SiO2 employing CF4/O2 or NF3/O2 at high temperature" in Japanese Journal of Applied Physics vol. 28, pp. 2368-2371. Published by Japan Society of Applied Physics in Nov. 1989. (Year: 1989).*

(Continued)

*Primary Examiner* — Tuan A Hoang
(74) *Attorney, Agent, or Firm* — Zilka-Kotab, P.C.

(57) ABSTRACT

According to one embodiment, a method includes forming a first insulative layer above a bottom surface of a groove and along inner sidewalls thereof, forming a source line layer within the groove of the substrate, forming a first dielectric layer on outer sides of a middle portion of the source line layer, forming a buffer layer on outer sides of the first dielectric layer, forming a gate terminal above the source line layer, forming a gate dielectric layer between the source line layer and the gate terminal and on outer sides of the lower portion of the gate terminal, forming a drain terminal including strained Si on outer sides of the first dielectric layer, and forming a relaxed buffer layer on outer sides of the upper portion of the source line layer and outer sides of the drain terminal, with the gate terminal extending beyond the relaxed buffer layer thickness.

16 Claims, 35 Drawing Sheets

(51) Int. Cl.
| | |
|---|---|
| H01L 29/417 | (2006.01) |
| H01L 21/768 | (2006.01) |
| H01L 43/12 | (2006.01) |
| H01L 23/528 | (2006.01) |
| G11C 11/16 | (2006.01) |
| H01L 23/522 | (2006.01) |
| H01L 43/02 | (2006.01) |
| H01L 43/08 | (2006.01) |
| H01L 29/78 | (2006.01) |
| H01L 21/3065 | (2006.01) |
| H01L 29/423 | (2006.01) |
| H01F 10/32 | (2006.01) |
| H01L 29/66 | (2006.01) |
| H01L 23/532 | (2006.01) |

(52) U.S. Cl.
CPC ..... *H01F 10/3259* (2013.01); *H01F 10/3272* (2013.01); *H01F 10/3286* (2013.01); *H01L 21/28158* (2013.01); *H01L 21/3065* (2013.01); *H01L 21/76802* (2013.01); *H01L 21/76877* (2013.01); *H01L 23/5226* (2013.01); *H01L 23/5283* (2013.01); *H01L 29/41741* (2013.01); *H01L 29/42364* (2013.01); *H01L 29/66666* (2013.01); *H01L 29/7827* (2013.01); *H01L 43/02* (2013.01); *H01L 43/08* (2013.01); *H01L 43/12* (2013.01); *H01L 23/53271* (2013.01)

(56) References Cited

U.S. PATENT DOCUMENTS

| | | | | |
|---|---|---|---|---|
| 5,505,816 | A * | 4/1996 | Barnes | H01L 21/31116 |
| | | | | 438/695 |
| 6,316,370 | B1 | 11/2001 | Mercaldi et al. | |
| 7,170,126 | B2 * | 1/2007 | Cheng | H01L 27/10864 |
| | | | | 257/296 |
| 8,916,477 | B2 | 12/2014 | Thedjoisworo et al. | |
| 2005/0040444 | A1 * | 2/2005 | Cohen | H01L 29/1054 |
| | | | | 257/288 |
| 2014/0145792 | A1 * | 5/2014 | Wang | H01F 10/329 |
| | | | | 331/94.1 |
| 2015/0311427 | A1 * | 10/2015 | Gottwald | G11C 11/161 |
| | | | | 257/421 |
| 2016/0322422 | A1 * | 11/2016 | Yokoyama | H01L 29/7827 |
| 2017/0092693 | A1 * | 3/2017 | Tan | H01L 43/08 |
| 2017/0213790 | A1 * | 7/2017 | Wang | H01L 21/76877 |
| 2017/0317274 | A1 * | 11/2017 | Seino | H01L 43/08 |
| 2018/0248113 | A1 * | 8/2018 | Pinarbasi | H01L 43/10 |

OTHER PUBLICATIONS

Oehrlein et al. "Studies of the reactive ion etching of SiGe alloys" in Journal of Vacuum Science and Technology A: Vacuum, Surfaces, and Films, vol. 9, pp. 768-774. Published by American Institute of Physics in 1991. (Year: 1991).*

Perry et al., "Fast anisotropic etching of silicon in an inductively coupled plasma reactor," Applied Physics Letters, vol. 55, No. 2, Jul. 1989, pp. 148-150.

Woo et al., "Selective Etching Technology of in-situ P Doped Poly-Si (SEDOP) for High Density DRAM Capacitors," Symposium on VLSI Technology Digest of Technical Papers, IEEE, 1994, pp. 25-26.

Kobayashi et al., "Nitridation of silicon oxide layers by nitrogen plasma generated by low energy electron impact," Applied Physics Letters, vol. 71, Oct. 6, 1997, pp. 1978-1980.

Habraken et al., "Thermal nitridation of silicon dioxide films," Journal of Applied Physics, vol. 53, No. 10, Oct. 1982, pp. 6996-7002.

Borel et al., "Isotropic etching of SiGe alloys with high selectivity to similar materials," Microelectronic Engineering, vol. 73-74, 2004, pp. 301-305.

Eneman et al., "Influence of dislocations in strained Si/relaxed SiGe layers on n+/p-junctions in a metal-oxide-semiconductor field-effect transistor technology," Applied Physics Letters, vol. 87, 2005, pp. 192112-1-192112-3.

Delhougne et al., "Development of a new type of SiGe thin strain relaxed buffer based on the incorporation of a carbon-containing layer," Applied Surface Science, vol. 224, 2004, pp. 91-94.

Ye et al., "High Tensile Strained In-Situ Phosphorus Doped Silicon Epitaxial Film for nMOS Applications," ECS Transactions, vol. 50, No. 9, 2012, pp. 1007-1011.

Williams et al., "Etch Rates for Micromachining Processing," Journal of Microelectromechanical Systems, vol. 5, No. 4, Dec. 4, 1996, pp. 256-269.

* cited by examiner

VERTICALLY-STRAINED SILICON DEVICE FOR USE WITH A PERPENDICULAR MAGNETIC TUNNEL JUNCTION (PMTJ)

FIELD OF THE INVENTION

The present invention relates to magnetic random access memory (MRAM), and more particularly to providing a vertically-strained silicon device for use with a perpendicular magnetic tunnel junction (pMTJ).

BACKGROUND

Magnetic Random Access Memory (MRAM) is a non-volatile data memory technology that stores data using magnetoresistive cells, such as Magnetoresistive Tunnel Junction (MTJ) elements. At their most basic level, such MTJ elements include first and second magnetic layers that are separated by a thin, non-magnetic tunnel barrier layer, which may be constructed of an insulating barrier material, such as MgO, $Al_2O_3$, etc. The first magnetic layer, which may be referred to as a reference layer, has a magnetization that is fixed in a direction that is perpendicular to that of a plane of the layer. The second magnetic layer has a magnetization that is free to move so that it may be oriented in either of two directions that are both generally perpendicular to the plane of the free magnetic layer. Therefore, the magnetization of the free layer may be either parallel with the magnetization of the reference layer or anti-parallel with the direction of the reference layer (i.e., opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. Each electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free layer and the reference layer are oriented in the same direction, the spin of the electrons in the free layer are generally in the same direction as the orientation of the spin of the electrons in the reference layer. Because these electron spins are generally in the same direction, the electrons may pass relatively easily through the tunnel barrier layer. However, if the orientations of the magnetizations of the free layer and the reference layer are opposite to one another, the spin of electrons in the free layer will generally be opposite to the spin of electrons in the reference layer. In this case, electrons do not easily pass through the barrier layer, resulting in a higher electrical resistance through the MTJ stack.

Because the MTJ element may be switched between low and high electrical resistance states, it may be used as a memory element to store data. For example, the low resistance state may be read as a "1" or one, whereas the high resistance state may be read as a "0" or zero. In addition, because the magnetic orientation of the magnetic free layer remains in its switched state without any electrical power being provided to the element, the memory storage provided by the MTJ element is robust and non-volatile.

To write a bit of data to the MTJ cell, the magnetic orientation of the magnetic free layer is switched from a first direction to a second direction that is 180° from the first direction. This may be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation.

Once the magnetization of the free layer has been switched by the current, the state of the MTJ element may be read by detecting a voltage across the MTJ element, thereby determining whether the MTJ element is in a "1" or "0" bit state. Advantageously, once the switching electrical current has been removed, the magnetic state of the free layer will remain in the switched orientation until some other time when an electrical current is applied to switch the MTJ element to the opposite state. Therefore, the recorded data bit is non-volatile in that it remains intact (the magnetic orientation of the free layer does not change) in the absence of any electrical current being supplied.

SUMMARY

According to one embodiment, a method includes forming a groove in a substrate in a film thickness direction, forming a first insulative layer above a bottom surface of the groove in the film thickness direction and along inner sidewalls thereof, forming a source line layer within the groove of the substrate that extends above the substrate in the film thickness direction, wherein an upper portion of the source line layer extends beyond a lower portion of the source line layer along a plane in an element width direction perpendicular to the film thickness direction, wherein the lower portion of the source line layer is within the groove, forming a first dielectric layer on outer sides of a middle portion of the source line layer in the element width direction, forming a buffer layer on outer sides of the first dielectric layer in the element width direction, forming a gate terminal above the source line layer, wherein a lower portion of the gate terminal extends beyond an upper portion of the gate terminal along the plane in the element width direction, forming a gate dielectric layer between the source line layer and the gate terminal in the film thickness direction and on outer sides of the lower portion of the gate terminal in the element width direction, forming a drain terminal including strained Si on outer sides of the first dielectric layer, and forming a relaxed buffer layer on outer sides of the upper portion of the source line layer and outer sides of the drain terminal, wherein an upper extent of the gate terminal extends beyond an upper extent of the relaxed buffer layer in the film thickness direction.

In another embodiment, a method includes forming a groove in a substrate in a film thickness direction, forming a first insulative layer above a bottom surface of the groove in the film thickness direction and along inner sidewalls thereof, forming a source line layer within the groove of the substrate that extends above the substrate in the film thickness direction, wherein an upper portion of the source line layer extends beyond a lower portion of the source line layer along a plane in an element width direction perpendicular to the film thickness direction, wherein the lower portion of the source line layer is within the groove, forming a first dielectric layer on outer sides of a middle portion of the source line layer in the element width direction, forming a buffer layer on outer sides of the first dielectric layer in the element width direction, forming a gate terminal above the source line layer, wherein a lower portion of the gate terminal extends beyond an upper portion of the gate terminal along the plane in the element width direction, forming a gate dielectric layer between the source line layer and the gate terminal in the film thickness direction and on outer sides of the lower portion of the gate terminal in the element width direction, forming a drain terminal including strained Si on outer sides of the first dielectric layer, forming a relaxed buffer layer on outer sides of the upper portion of the source line layer and outer sides of the drain terminal, wherein an upper extent of the gate terminal extends beyond an upper extent of the relaxed buffer layer in the film thickness direction, forming two side vias above the drain terminal and the relaxed buffer layer, the side vias being formed on either side of the gate terminal in the element width direction, forming a center via above the gate terminal, forming three electrodes, each electrode being formed above one of the vias, forming two perpendicular magnetic tunnel junctions (pMTJs), one above each of the side vias, forming two extension layers, one above each of the pMTJs, forming a second via above the electrode that is formed above the center via, forming three bit line layers, one above each of the electrodes, forming a third via above a center bit line layer, forming a second insulative layer around the center via, the side vias, the pMTJs, the electrodes, the extension layers, the second via, the bit line layers, and the third via, the second insulative layer defining three pillars and insulating the pillars from one another, each pillar including one of the electrodes and one of the bit line layers, and forming a word line layer above the third via and the second insulative layer.

In accordance with another embodiment, an apparatus includes a first insulative layer positioned above a bottom surface of a groove in a substrate in a film thickness direction and along inner sidewalls of the groove in the substrate, a source line layer positioned within the groove in the substrate that extends above the substrate in the film thickness direction, wherein an upper portion of the source line layer extends beyond a lower portion of the source line layer along a plane in an element width direction perpendicular to the film thickness direction, wherein the lower portion of the source line layer is within the groove, a first dielectric layer positioned on outer sides of a middle portion of the source line layer in the element width direction, a buffer layer positioned on outer sides of the first dielectric layer in the element width direction, a gate terminal positioned above the source line layer, wherein a lower portion of the gate terminal extends beyond an upper portion of the gate terminal along the plane in the element width direction, a gate dielectric layer positioned between the source line layer and the gate terminal in the film thickness direction and on outer sides of the lower portion of the gate terminal in the element width direction, a drain terminal including strained Si positioned on outer sides of the first dielectric layer, a relaxed buffer layer positioned on outer sides of the upper portion of the source line layer and outer sides of the drain terminal, wherein an upper extent of the gate terminal extends beyond an upper extent of the relaxed buffer layer in the film thickness direction, two side vias positioned above the drain terminal and the relaxed buffer layer, the side vias being positioned on either side of the gate terminal in the element width direction, a center via positioned above the gate terminal, three electrodes, each electrode being positioned above one of the vias, two pMTJs, one pMTJ positioned above each of the side vias, two extension layers, one extension layer positioned above each of the pMTJs, a second via positioned above the electrode that is positioned above the center via, three bit line layers, one bit line layer positioned above each of the electrodes, a third via positioned above a center bit line layer, a second insulative layer positioned around the center via, the side vias, the pMTJs, the electrodes, the extension layers, the second via, the bit line layers, and the third via, the second insulative layer defining three pillars and insulating the pillars from one another, each pillar including one of the electrodes and one of the bit line layers, and a word line layer positioned above the third via and the second insulative layer.

These and other features and advantages of the invention will be apparent to one of skill in the art upon reading of the following detailed description of the embodiments in conjunction with the figures. In the figures, like reference numerals used in more than one figure indicate a like element, and may be considered in light of the description of the like element presented in any of the other figures having the like element.

BRIEF DESCRIPTION OF THE DRAWINGS

For a fuller understanding of the nature and advantages of this invention, as well as the preferred mode of use, reference should be made to the following detailed description read in conjunction with the accompanying drawings. The drawings are not presented to scale unless specified otherwise on an individual basis.

DETAILED DESCRIPTION

Figure 1:
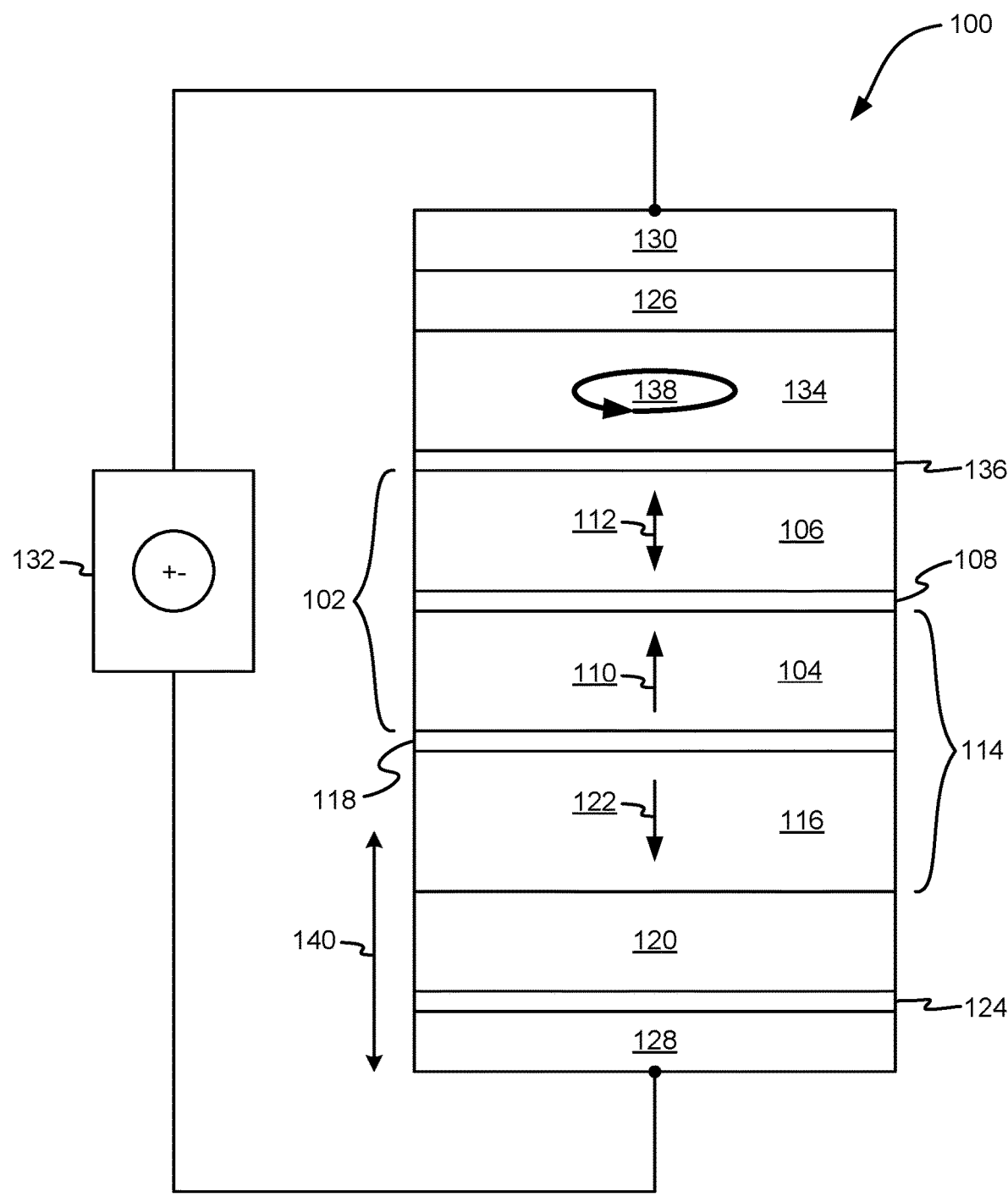
FIG. 1 is a schematic, cross-sectional view of a portion of a magnetic memory element, which may be used in embodiments of the invention.

The following description includes the best embodiments presently contemplated for carrying out the invention. This description is made for the purpose of illustrating the general principles of this invention and is not meant to limit the inventive concepts claimed herein in any way.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an," and "the" include plural referents unless otherwise specified.

Moreover, the term "about" when used herein to modify a value indicates a range that includes the value and less and greater than the value within a reasonable range. In the absence of any other indication, this reasonable range is plus and minus 10% of the value. For example, "about 10 nanometers" indicates 10 nm±1 nm, such that the range includes all values in a range including 9 nm up to and including 11 nm.

Also, the term "comprise" indicates an inclusive list of those elements specifically described without exclusion of any other elements. For example, "a list comprises red and green" indicates that the list includes, but is not limited to, red and green. Therefore, the list may also include other colors not specifically described.

According to one general embodiment, a method includes forming a groove in a substrate in a film thickness direction, forming a first insulative layer above a bottom surface of the groove in the film thickness direction and along inner sidewalls thereof, forming a source line layer within the groove of the substrate that extends above the substrate in the film thickness direction, wherein an upper portion of the source line layer extends beyond a lower portion of the source line layer along a plane in an element width direction perpendicular to the film thickness direction, wherein the lower portion of the source line layer is within the groove, forming a first dielectric layer on outer sides of a middle portion of the source line layer in the element width direction, forming a buffer layer on outer sides of the first dielectric layer in the element width direction, forming a gate terminal above the source line layer, wherein a lower portion of the gate terminal extends beyond an upper portion of the gate terminal along the plane in the element width direction, forming a gate dielectric layer between the source line layer and the gate terminal in the film thickness direction and on outer sides of the lower portion of the gate terminal in the element width direction, forming a drain terminal including strained Si on outer sides of the first dielectric layer, and forming a relaxed buffer layer on outer sides of the upper portion of the source line layer and outer sides of the drain terminal, wherein an upper extent of the gate terminal extends beyond an upper extent of the relaxed buffer layer in the film thickness direction.

In another general embodiment, a method includes forming a groove in a substrate in a film thickness direction, forming a first insulative layer above a bottom surface of the groove in the film thickness direction and along inner sidewalls thereof, forming a source line layer within the groove of the substrate that extends above the substrate in the film thickness direction, wherein an upper portion of the source line layer extends beyond a lower portion of the source line layer along a plane in an element width direction perpendicular to the film thickness direction, wherein the lower portion of the source line layer is within the groove, forming a first dielectric layer on outer sides of a middle portion of the source line layer in the element width direction, forming a buffer layer on outer sides of the first dielectric layer in the element width direction, forming a gate terminal above the source line layer, wherein a lower portion of the gate terminal extends beyond an upper portion of the gate terminal along the plane in the element width direction, forming a gate dielectric layer between the source line layer and the gate terminal in the film thickness direction and on outer sides of the lower portion of the gate terminal in the element width direction, forming a drain terminal including strained Si on outer sides of the first dielectric layer, forming a relaxed buffer layer on outer sides of the upper portion of the source line layer and outer sides of the drain terminal, wherein an upper extent of the gate terminal extends beyond an upper extent of the relaxed buffer layer in the film thickness direction, forming two side vias above the drain terminal and the relaxed buffer layer, the side vias being formed on either side of the gate terminal in the element width direction, forming a center via above the gate terminal, forming three electrodes, each electrode being formed above one of the vias, forming two perpendicular magnetic tunnel junctions (pMTJs), one above each of the side vias, forming two extension layers, one above each of the pMTJs, forming a second via above the electrode that is formed above the center via, forming three bit line layers, one above each of the electrodes, forming a third via above a center bit line layer, forming a second insulative layer around the center via, the side vias, the pMTJs, the electrodes, the extension layers, the second via, the bit line layers, and the third via, the second insulative layer defining three pillars and insulating the pillars from one another, each pillar including one of the electrodes and one of the bit line layers, and forming a word line layer above the third via and the second insulative layer.

In accordance with another general embodiment, an apparatus includes a first insulative layer positioned above a bottom surface of a groove in a substrate in a film thickness direction and along inner sidewalls of the groove in the substrate, a source line layer positioned within the groove in the substrate that extends above the substrate in the film thickness direction, wherein an upper portion of the source line layer extends beyond a lower portion of the source line layer along a plane in an element width direction perpendicular to the film thickness direction, wherein the lower portion of the source line layer is within the groove, a first dielectric layer positioned on outer sides of a middle portion of the source line layer in the element width direction, a buffer layer positioned on outer sides of the first dielectric layer in the element width direction, a gate terminal positioned above the source line layer, wherein a lower portion of the gate terminal extends beyond an upper portion of the gate terminal along the plane in the element width direction, a gate dielectric layer positioned between the source line layer and the gate terminal in the film thickness direction and on outer sides of the lower portion of the gate terminal in the element width direction, a drain terminal including strained Si positioned on outer sides of the first dielectric layer, a relaxed buffer layer positioned on outer sides of the upper portion of the source line layer and outer sides of the drain terminal, wherein an upper extent of the gate terminal extends beyond an upper extent of the relaxed buffer layer in the film thickness direction, two side vias positioned above the drain terminal and the relaxed buffer layer, the side vias being positioned on either side of the gate terminal in the element width direction, a center via positioned above the gate terminal, three electrodes, each electrode being positioned above one of the vias, two pMTJs, one pMTJ positioned above each of the side vias, two extension layers, one extension layer positioned above each of the pMTJs, a second via positioned above the electrode that is positioned above the center via, three bit line layers, one bit line layer positioned above each of the electrodes, a third via positioned above a center bit line layer, a second insulative layer positioned around the center via, the side vias, the pMTJs, the electrodes, the extension layers, the second via, the bit line layers, and the third via, the second insulative layer defining three pillars and insulating the pillars from one another, each pillar including one of the electrodes and one of the bit line layers, and a word line layer positioned above the third via and the second insulative layer.

Referring to FIG. 1, a magnetic memory element 100 is shown according to one embodiment. The memory element 100 may be used in a perpendicular magnetic tunnel junction (pMTJ) memory element, as described in various embodiments herein. The memory element 100 may include a magnetic tunnel junction (MTJ) 102 that may include a magnetic reference layer 104, a magnetic free layer 106, and a thin, non-magnetic, electrically-insulating magnetic barrier layer 108 positioned between the reference layer 104 and the free layer 106 in a film thickness direction 140. The barrier layer 108 may include an oxide, such as MgO, $Al_2O_3$, etc., or some other suitable material known in the art. The reference layer 104 has a magnetization 110 that is fixed in a direction that is perpendicular to a horizontal plane of the layer, as indicated by the arrow. The horizontal plane is sometimes referred to as a plane of formation in the embodiments described herein. The free layer 106 has a magnetization 112 that may be in either of two directions perpendicular to a horizontal plane of the free layer 106, as indicated by the two arrows. While the magnetization 112 of the free layer 106 remains in either of two directions perpendicular to the plane of the free layer 106 in a quiescent state, it may be selectable switched between these two directions, as is described in greater detail herein. When the magnetization 112 of the free layer 106 is in the same direction as the magnetization 110 of the reference layer 104, the electrical resistance across the MTJ 102 is at a low resistance state. Conversely, when the magnetization 112 of the free layer 106 is opposite to the magnetization 110 of the reference layer 104, the electrical resistance across the MTJ 102 is in a high resistance state.

The reference layer 104 may be part of an anti-parallel magnetic pinning structure 114 that may include a magnetic pinned layer 116 and a non-magnetic, antiparallel coupling layer 118 positioned between the pinned layer 116 and the reference layer 104 in the film thickness direction 140. The antiparallel coupling layer 118 may comprise any suitable material known in the art, such as Ru, and may be constructed to have a thickness that causes ferromagnetic antiparallel coupling of the pinned layer 116 and the reference layer 104.

In one approach, the pinned layer 116 may be exchange coupled with an antiferromagnetic layer 120, which may comprise any suitable material known in the art, such as IrMn. Exchange coupling between the antiferromagnetic layer 120 and the pinned layer 116 strongly pins the magnetization 122 of the pinned layer 116 in a first direction. The antiparallel coupling between the pinned layer 116 and the reference layer 104 pins the magnetization 110 of the reference layer 104 in a second direction opposite to the direction of magnetization 122 of the pinned layer 116.

According to one approach, a seed layer 124 may be positioned below the pinned layer 116 in the film thickness direction 140 to initiate a desired crystalline structure in the layers deposited thereabove.

In another approach, a capping layer 126 may be positioned above the free layer 106 to protect the underlying layers during manufacture, such as during high temperature annealing.

A lower electrode 128 and an upper electrode 130 may be positioned near a bottom and a top of the memory element 100, respectively, in one approach. The lower electrode 128 and the upper electrode 130 may be constructed of a non-magnetic, electrically conductive material of a type known in the art, such as Ru, Au, Ag, Cu, etc., and may provide an electrical connection with a circuit 132. The circuit 132 may include a current source, and may further include circuitry for reading an electrical resistance across the memory element 100.

The magnetic free layer 106 has a magnetic anisotropy that causes the magnetization 112 of the free layer 106 to remain stable in one of two directions perpendicular to the horizontal plane of the free layer 106. In a write mode of use for the memory element 100, the orientation of the magnetization 112 of the free layer 106 may be switched between these two directions by applying an electrical current through the memory element 100 via the circuit 132. A current in a first direction causes the magnetization 112 of the free layer 106 of the memory element 100 to flip to a first orientation, and a current in a second direction opposite to the first direction causes the magnetization 112 of the free layer 106 of the memory element 100 to flip to a second, opposite direction.

For example, if the magnetization 112 is initially oriented in an upward direction in FIG. 1, applying a current in a downward direction through the memory element 100 causes electrons to flow in an opposite direction upward through the memory element 100. Electrons travelling through the reference layer 104 become spin polarized as a result of the magnetization 110 of the reference layer 104. These spin-polarized electrons cause a spin torque on the magnetization 112 of the free layer 106, which causes the magnetization 112 to flip directions, from the upward direction to a downward direction.

On the other hand, if the magnetization 112 of the free layer 106 is initially in a downward direction in FIG. 1, applying an electrical current through the memory element 100 in an upward direction in FIG. 1 causes electrons to flow in an opposite direction, downward through the memory element 100. However, because the magnetization 112 of the free layer 106 is opposite to the magnetization 110 of the reference layer 104, the electrons will not be able to pass through the barrier layer 108. As a result, the electrons (which have been spin polarized by the magnetization 112 of the free layer 106) will accumulate at the junction between the free layer 106 and the barrier layer 108. This accumulation of spin polarized electrons causes a spin torque that causes the magnetization 112 of the free layer 106 to flip from the downward direction to an upward direction.

In order to assist the switching of the magnetization 112 of the free layer 106, the memory element 100 may include a spin polarization layer 134 positioned above the free layer 106. The spin polarization layer 134 may be separated from the free layer 106 by an exchange coupling layer 136. The spin polarization layer 134 has a magnetic anisotropy that causes it to have a magnetization 138 with a primary component oriented in the in plane direction (e.g., perpendicular to the magnetization 112 of the free layer and the magnetization 110 of the reference layer 104). The magnetization 138 of the spin polarization layer 134 may be fixed in one approach, or may move in a precessional manner as shown in FIG. 1. The magnetization 138 of the spin polarization layer 134 causes a spin torque on the free layer 106 that assists in moving its magnetization 112 away from its quiescent state perpendicular to the plane of the free layer 106. This allows the magnetization 112 of the free layer 106 to more easily flip with less energy being utilized to flip the magnetization 112 in response to applying a write current to the memory element 100.

The memory element 100 described in FIG. 1 is intended to provide context to the various embodiments described herein. The structures and methods described herein in accordance with various embodiments may comprise a portion of the memory element 100 described in FIG. 1 and/or used in conjunction with the memory element 100, in various approaches.

Figure 2:
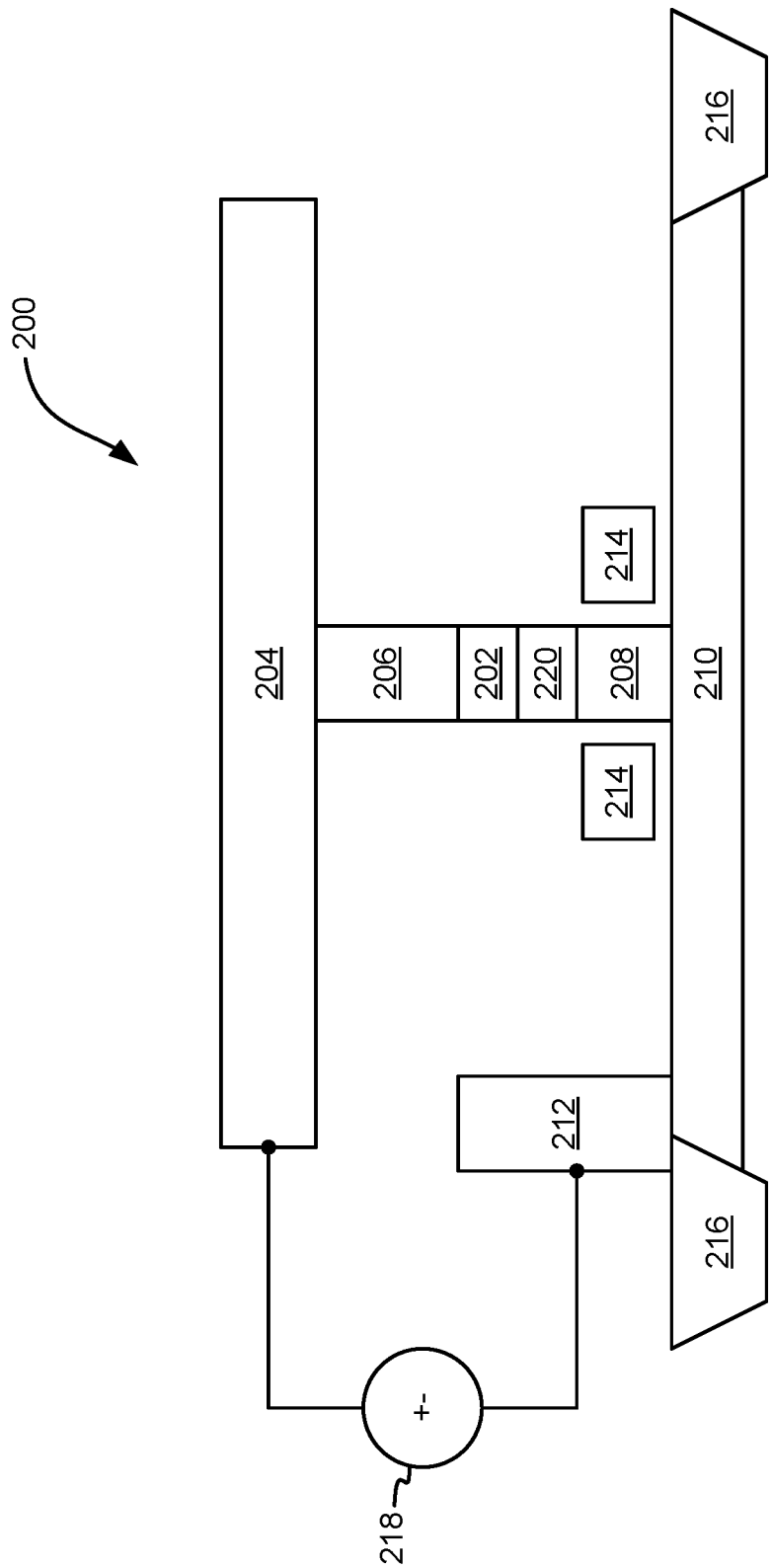
FIG. 2 is a schematic, cross-sectional view of a portion of a magnetic random access memory (MRAM) that includes a magnetoresistive sensor, which may be used in embodiments of the invention.

Now referring to FIG. 2, a portion of a magnetic random access memory (MRAM) structure 200 that includes a magnetoresistive sensor 202 is shown according to one embodiment. The MRAM structure 200 may be operated and utilized as understood by those of skill in the art, with any special use cases being specified in accordance with an embodiment herein. The memory element 100 described in FIG. 1 may be used as the magnetoresistive sensor 202 of FIG. 2 in accordance with embodiments that store data in MRAM. In one embodiment, an MTJ element may be used as the magnetoresistive sensor 202.

The MRAM structure 200 includes a bit line 204 that supplies current across the magnetoresistive sensor 202 from a voltage source 218. The bit line 204 may comprise any suitable material known in the art, such as TaN, W, TiN, Au, Ag, Cu, etc. An extension layer 206 electrically couples the magnetoresistive sensor 202 with the bit line 204. The extension layer 206 may comprise any suitable material known in the art, such as Ru, Ta, etc. A source terminal 220 is coupled between the magnetoresistive sensor 202 and a channel layer 208, which is in electrical contact with a n+ source layer 210. The channel layer 208 may comprise any suitable semiconductor material known in the art, such as Si, Ge, GaAs-compounds, etc. The n+ source layer 210 may comprise any suitable material known in the art, such as TaN, W, TiN, Au. Ag, Cu, etc., and is electrically coupled to the voltage source 218 via a source line 212, which may comprise any suitable material known in the art, such as TaN, W, TiN, Au, Ag, Cu, etc. Positioned across the channel layer 208 is a word line 214 which may comprise any suitable material known in the art, such as TaN, W, TiN, Au, Ag, Cu, etc. On either side of the n+ source layer 210 are shallow trench isolation (STI) layers 216 which provide electrical insulation between an adjacent n+ source layer 210. Moreover, although not specifically shown, electrically insulative material may be positioned around the various layers shown in FIG. 2, as would be understood by one of skill in the art.

Figure 3:
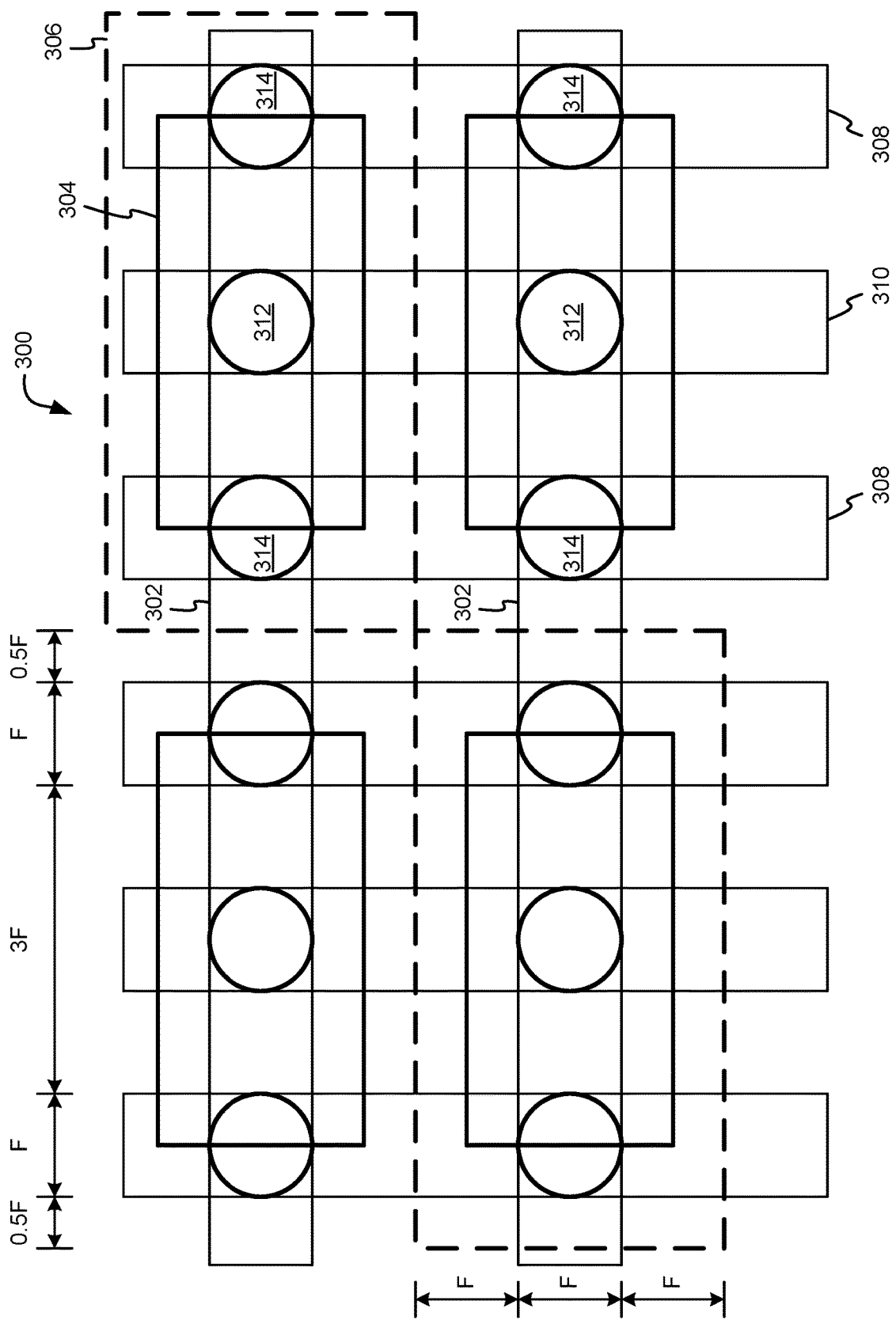
FIG. 3 shows a bitcell layout, in one embodiment.

With reference to FIG. 3, a bitcell layout 300 is shown according to one embodiment. Using this bitcell layout 300, each cell 306 has a cell size of only $(3F \times 6F)/2 = 9F^2$ in semiconductor surface area, which is desirably low in comparison to comparable structures known in the art. Each cell 306 includes a deep hole structure 304 in which connections 314 are made from a gate line 302 to bit lines 308 and a connection 312 is made from a gate line 302 to a source line 310. As shown, the cells 306 have a cushion of 0.5 F on each side thereof, a horizontal pitch of 2.0 F between centerlines of the various connection lines in the vertical direction, and a vertical pitch of 3.0 F between centerlines of the gate lines 302 in the horizontal direction.

Any suitable materials may be used to form the various structures shown in FIG. 3, as would be known to one of skill in the art. In various approaches, a substrate on which the structures are formed may comprise $SiO_2$, $Al_2O_3$, MgO, combinations thereof, etc., the source lines 310 may comprise Si doped with B and/or similar suitable materials known in the art, the bit lines 308 may comprise Si doped with P, Si doped with Ar, Si doped with an alkaline metal (e.g., Be, Mg, Ca, Sr, Ba, and/or Ra), similar suitable materials known in the art, and/or combinations thereof. In more approaches, insulative layers positioned between the various structures shown in FIG. 3 may comprise $SiO_2$, SiON, $ZrO_2$, $HfO_2$, $Al_2O_3$, similar suitable materials, and/or combinations thereof, and the gate layers 302 may comprise doped polysilicon, W, TaN, TiNi, TiN, similar suitable materials, and/or combinations thereof.

Figure 4:
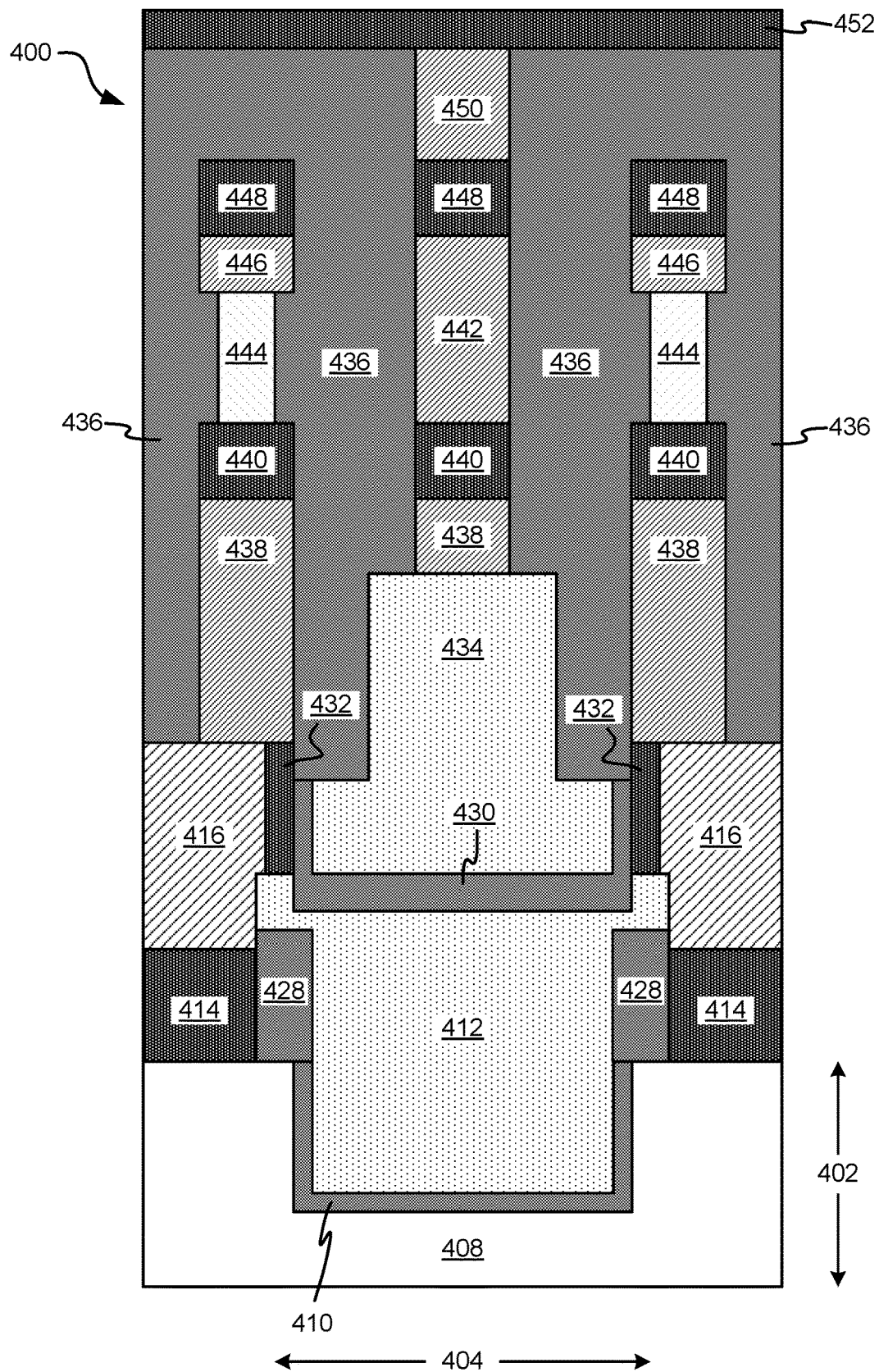
FIG. 4 shows a cross-sectional diagram of a vertically-strained silicon structure according to one embodiment.

Now referring to FIG. 4, a cross-sectional diagram of a vertically-strained silicon structure 400 is shown according to one embodiment. The vertically-strained silicon structure 400 or some portion thereof may be used in the various embodiments disclosed herein.

As shown, a substrate 408 includes a deep hole structure (the depression in the substrate) in which a first insulative layer 410 is positioned thereon in a film thickness direction 402 and along sides of the deep hole structure in at least an element width direction 404 (and also in an element depth direction into the page in some approaches, e.g., around all inner sides of the deep hole structure). The first insulative layer 410 has a U-shape when viewed in cross-section. Above the first insulative layer 410, a source line layer 412 is positioned which extends above the deep hole structure in the film thickness direction 402 by a distance that is at least as great as a thickness of a first dielectric layer 428 positioned around outer sides of a middle portion of the source line layer 412. This is referred to as a buried source line in some descriptions, due to its positioning beneath the other layers of the vertically-strained silicon structure 400.

An upper portion of the source line layer 412 extends beyond extents of the deep hole structure in at least the element width direction 404 (and also in an element depth direction in some approaches, e.g., around all outer sides of the source line layer 412). In one embodiment, a buffer layer 414 may be positioned around outer sides of the first dielectric layer 428 in the element width direction (and also in an element depth direction in some approaches). Positioned above the buffer layer 414 is a relaxed buffer layer 416, which is positioned around sides of a drain terminal 432. The drain terminal 432 is positioned around sides of a gate dielectric layer 430 and acts as a drain for the transistor of the structure 400. The gate dielectric layer 430 is positioned centrally above the source line layer 412 and below and around sides of a lower portion of a gate terminal 434. The gate dielectric layer 430 has a U-shape when viewed in cross-section, while the gate terminal 434 has an inverted T-shape when viewed in cross-section.

The vertically-strained silicon structure 400 also includes three pillars, two pillars positioned above a combination of upper surfaces of the relaxed buffer layer 416 and the drain terminal 432, and a single pillar positioned above the gate terminal 434. Each pillar is constructed of a via 438 positioned below an electrode 440. The center pillar then includes a second via 442 positioned above the electrode 440, while the other two pillars include a pMTJ 444 positioned above the electrode 440, followed by an extension layer 446 positioned above the pMTJ 444. Each of the three pillars then include a bit line layer 448, with the center pillar further including a third via 450 positioned above the center bit line layer 448. All three pillars are surrounded by a second insulative layer 436, and directly above the third via 450 and upper surfaces of the second insulative layer 436 is a word line layer 452.

In one embodiment, the relaxed buffer layer 416 may comprise SiGe or some other suitable material known in the art. Moreover, in a further embodiment, an upper portion of the relaxed buffer layer 416 may be doped with one or more particular elements or materials, such as Si or some other suitable doping material known in the art. In accordance with another embodiment, the relaxed buffer layer 416 may have a gradient composition where a lower portion thereof is pure or substantially pure SiGe, which gradually has increasing levels of dopant incorporated therein up to the upper surface of the relaxed buffer layer 416.

As shown in FIG. 4, each pillar has a width in the element width direction 404 that is less than a width of the relaxed buffer layer 416 and less than a width of the gate terminal 434. Moreover, each pMTJ 444 has a width that is less than a greatest width of its corresponding electrode 440. In one embodiment, the vias 438, electrodes 440, second via 442, extension layers 446, bit line layers 448, and third via 450 may each have about the same width in the element width direction 404 (and possibly in the element depth direction in some approaches).

In various embodiments, the substrate 408 may comprise Si or some other suitable material known in the art. The first insulative layer 410, the second insulative layer 436, the first dielectric layer 428, and the gate dielectric layer 430 may comprise any suitable electrically insulating material known in the art, including dielectrics, such as $SiO_2$, SiON, $ZrO_2$, $HfO_2$, and $Al_2O_3$, combinations thereof, etc. The source line layer 412 may be an n+ doped Si, such as Si doped with B and/or similar suitable materials known in the art. The buffer layer 414 may comprise SiGe or some other suitable material known in the art, while the relaxed buffer layer 416 may comprise relaxed SiGe in which threading dislocation density (TDD) is low, such as in a range from about $10^3$ cm$^{-2}$ to about $10^5$ cm$^{-2}$, e.g., $10^4$ cm$^{-2}$, in one embodiment.

In more embodiments, the drain terminal 432 may comprise strained Si, such as Si—Fe and/or Ge—F, which is created from sidewalls of the surrounding relaxed buffer layer 416 by breaking the bonds of the relaxed SiGe to become volatile $SiF_x$ and $GeF_y$. Selectivity of SiGe:Si of 60:1 is achieved using pure $CF_4$ etchant gas and growing a strained vertical Si channel therefrom.

In another embodiment, the gate terminal 434 may comprise a p+ doped Si, such as Si doped with P, Si doped with Ar, Si doped with an alkaline metal (e.g., Be, Mg, Ca, Sr, Ba, and/or Ra), doped polysilicon, W, TaN, TiNi, TiN, Au, Ag, Cu, similar suitable materials known in the art, and/or combinations thereof.

In accordance with more embodiments, each via 438, the second via 442, and the extension layer 446 may comprise W, TaN, TiNi, TiN, Au, Ag, Cu, similar suitable materials known in the art, and/or combinations thereof. The electrodes 440 may comprise W, TaN, TiNi, TiN, Au, Ag, Cu, similar suitable materials known in the art, and/or combinations thereof. Also, the bit line layer 448 and the word line layer 452 may comprise W, TaN, TiNi, TiN, Au, Ag, Cu, similar suitable materials known in the art, and/or combinations thereof.

Each of the pMTJ elements 444, can be a pMTJ such as illustrated by way of example, as pMTJ 100, which can include a reference layer 104, free layer 106 and a barrier later 108 located between the reference layer 104 and free layer 106. In addition, each pMTJ 444 may comprise a seed layer, an underlayer positioned above the seed layer, a synthetic antiferromagnetic (SAF) seed layer positioned above the underlayer, a first SAF layer positioned above the SAF seed layer, a spacer layer positioned above the first SAF layer, an antiferromagnetic (AFM) coupling layer positioned above the spacer layer, a second SAF layer positioned above the AFM coupling layer, a ferromagnetic (FM) coupling layer positioned above the second SAF layer, a reference layer that comprises a first reference layer positioned below a second reference layer, a barrier layer positioned above the reference layer, a free layer which includes a lower free layer positioned above the barrier layer, a middle free layer positioned above the lower free layer, and an upper free layer positioned above the middle free layer. The pMTJs may also comprise a first cap layer positioned above the upper free layer, a second cap layer positioned above the first cap layer, a third cap layer positioned above the second cap layer, and a fourth cap layer positioned above the third cap layer.

According to one embodiment, the seed layer may be formed above a poly-crystalline layer that includes many grain boundaries, such as TaN. The seed layer may act to stop texture propagation from this poly-crystalline layer. Otherwise, the grain structure of the poly-crystalline layer may propagate upward in the structure. The seed layer may comprise Ta and/or a suitable material known in the art and may have a thickness of about 1 nm.

The underlayer may be used to facilitate recrystallization of the subsequently formed SAF layers during post-pMTJ annealing. It may comprise Ru and/or a suitable material known in the art and may have a thickness of about 3 nm.

The SAF seed layer may comprise Pt and/or a suitable material known in the art and may have a thickness of about 0.25 nm. It may be used to spur growth of the first SAF layer. The first SAF layer exhibits a strong perpendicular anisotropy field, and may comprise CoPt and/or a suitable material known in the art, with a thickness of about 1.5 nm. The spacer layer may comprise Co and/or a suitable material known in the art and may have a thickness of about 0.35 nm.

The AFM coupling layer may comprise Ru and/or a suitable material known in the art, with a thickness of about 0.85 nm. The AFM coupling layer is positioned between the first and second SAF layers to cause the second SAF layer to have antiferromagnetic coupling with the first SAF layer. The second SAF layer may comprise Co and/or a suitable material known in the art and may have a thickness of about 0.9 nm.

The FM coupling layer may comprise Mo and/or a suitable material known in the art, with a thickness of about 0.35 nm. The FM coupling layer may provide ferromagnetic-coupling between the second SAF layer and the reference layer.

The first reference layer may comprise CoFeB40 and/or a suitable material known in the art, with a thickness of about 0.5 nm, while the second reference layer may comprise CoFeB30 and/or a suitable material known in the art, with a thickness of about 0.3 nm. The reference layer has different compositions along the film thickness direction. In one embodiment, a higher Fe concentration is present in the second reference layer for more spin-polarized current, while a higher Co concentration is present in the first reference layer for better coupling with the second SAF layer.

The barrier layer may comprise MgO and/or a suitable material known in the art, with an average resistance area product of about RA=7. The barrier layer may be deposited using DC sputtering where metallic Mg is deposited and subsequently oxidized with oxygen in order to form MgO.

A wetting layer may be positioned above the barrier layer, in one embodiment. The wetting layer is a very thin layer which causes an upper surface of the MgO of the barrier layer to become sticky, thereby prohibiting island formation during subsequent CoFeB deposition of the lower free layer. This wetting layer may be deposited at a low temperature (about 100K) and comprise a few (e.g., three to one hundred) monolayers of Fe, in one approach.

The lower free layer may comprise CoFeB20 and/or a suitable material known in the art, with a thickness of about 1.4 nm. The middle free layer may comprise W and/or a suitable material known in the art, with a thickness of about 0.3 nm, and the upper free layer may comprise CoFeB20 and/or a suitable material known in the art, with a thickness of about 0.6 nm. The free layer is configured to flip magnetic orientation in the presence of spin-torque current. The W of the middle free layer blocks B diffusion through the middle free layer, while also gathering and trapping the B inside the W material.

The first cap layer may comprise MgO and/or a suitable material known in the art and may have an average resistance area product of about RA=1.0, the second cap layer may comprise CoFeB20 and/or a suitable material known in the art and may have a thickness of about 0.6 nm, the third cap layer may comprise Ta and/or a suitable material known in the art and may have a thickness of about 3 nm, and the fourth cap layer may comprise Ru and/or a suitable material known in the art and may have a thickness of about 10 nm. The collection of capping layers act to block metallic ion diffusion from above, and to resist pMTJ 444 metallization. Ru is widely used to electrically extend the pMTJs 444 to another electrical terminal that may be positioned and/or formed above the pMTJs 444.

Figure 5A:
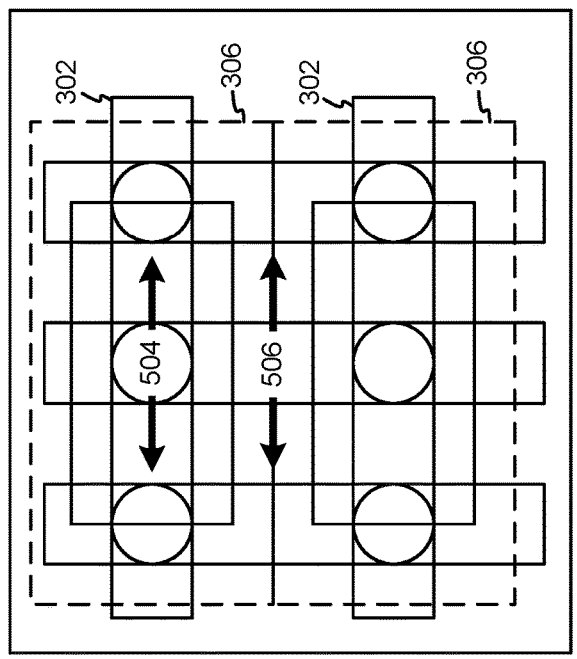
FIGS. 5A-5CC show various structures created during manufacture of a vertically-strained silicon structure, in one embodiment.
Figure 5A:
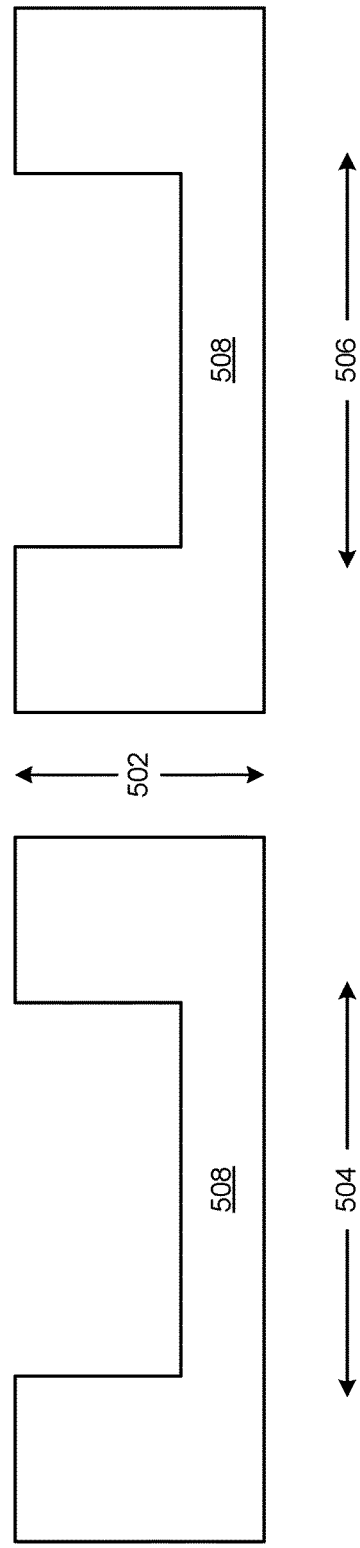
Figure 5B:
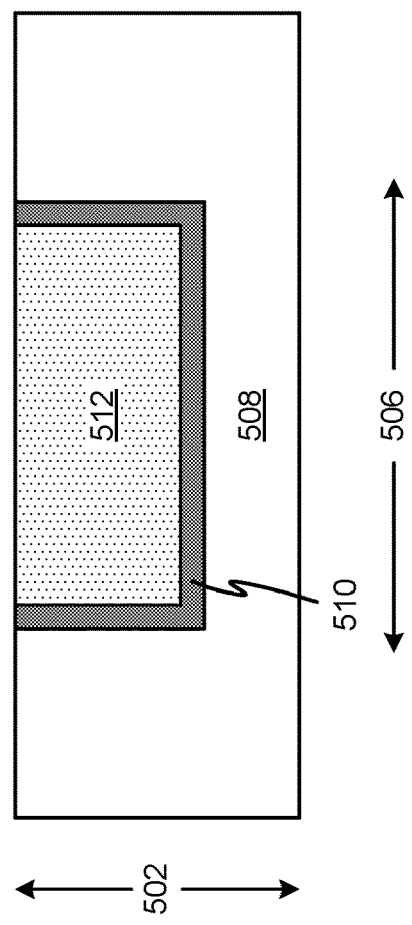
Figure 5B:
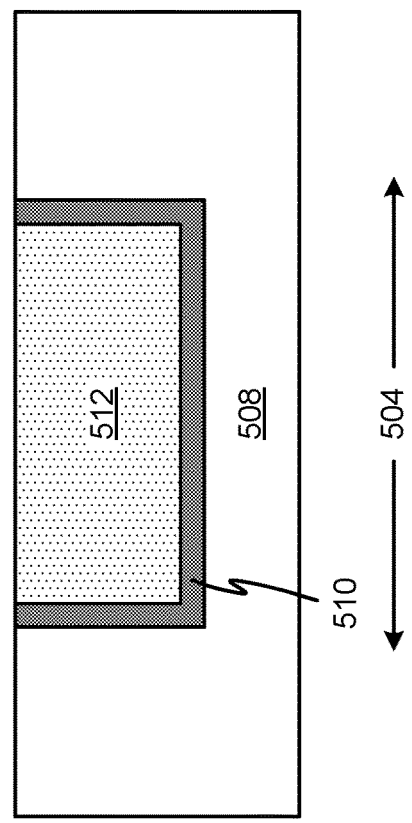
Figure 5C:
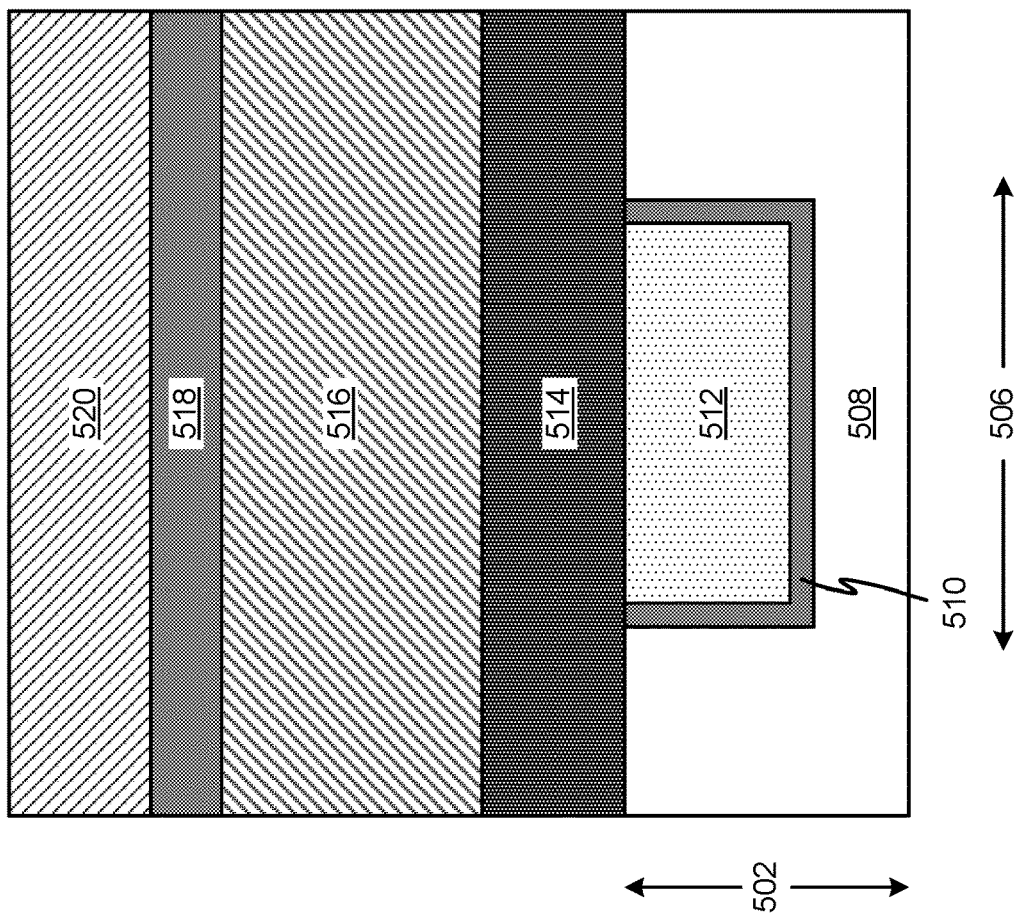

With reference to FIGS. 5A-5CC, formation of a vertically-strained silicon structure is shown according to one embodiment. The vertically-strained silicon structure may be formed in accordance with the present invention in any of the environments depicted in FIGS. 1-4, among others not specifically described, in various approaches. Of course, more steps, layers, and/or structures may be utilized in the formation of any of the structures and/or layers thereof than those specifically described in FIGS. 5A-5CC, as would be understood by one of skill in the art upon reading the present descriptions.

Each of the intermediate structures shown in FIGS. 5A-5CC may be formed by any suitable component of the operating environment. For example, in various embodiments, the structure(s) may be partially or entirely formed by a machine, controller, processing circuit, or some other device or combination of devices suitable for manufacturing and/or processing a thin film structure. A processing circuit may include one or more processors, chips, and/or modules implemented in hardware and/or software, and preferably having at least one hardware component, and may be utilized in any device to form one or more structures or layer thereof. Illustrative processing circuits include, but are not limited to, a central processing circuit (CPU), an application specific integrated circuit (ASIC), a field programmable gate array (FPGA), etc., combinations thereof, or any other suitable computing device known in the art.

In the descriptions of the formation of the various layers in FIGS. 5A-5CC, each layer may be formed using any known deposition process, such as sputtering, plating, chemical vapor deposition (CVD), plasma chemical vapor deposition (pCVD), (PECVD), physical vapor deposition (PVD), molecular beam epitaxy (MBE), atomic layer deposition (ALD), etc. Moreover, any descriptions of removal of layers and/or material may be performed using any material removal process of a type known in the art, such as planarization, chemical mechanical polishing (CMP), recess etching, reactive ion etching (RIE), ion milling, plasma etching, photolithography, etc.

In each of FIGS. 5A-5AA, two views are shown, a left view and a right view. In FIG. 5A, an inset shows where these views are taken from in relation to the bitcell layout. The left view is indicated by an element width direction 504 that is taken across a center of a connection to the gate line 302 for a cell 306. The right view in FIGS. 5A-5AA is indicated by an element width direction 506 taken between the cells 306 of the bitcell layout.

As shown in FIG. 5A, a groove or depression is formed in a substrate 506 in a film thickness direction 502, which will be used for formation of the source line layer. As shown in FIG. 5B, a first insulative layer 510 is formed above a bottom surface of the groove in the film thickness direction 502 and along inner sidewalls thereof. Then, material is deposited for the source line layer 512 (this material forms a lower portion of the source line layer 512).

Figure 5D:
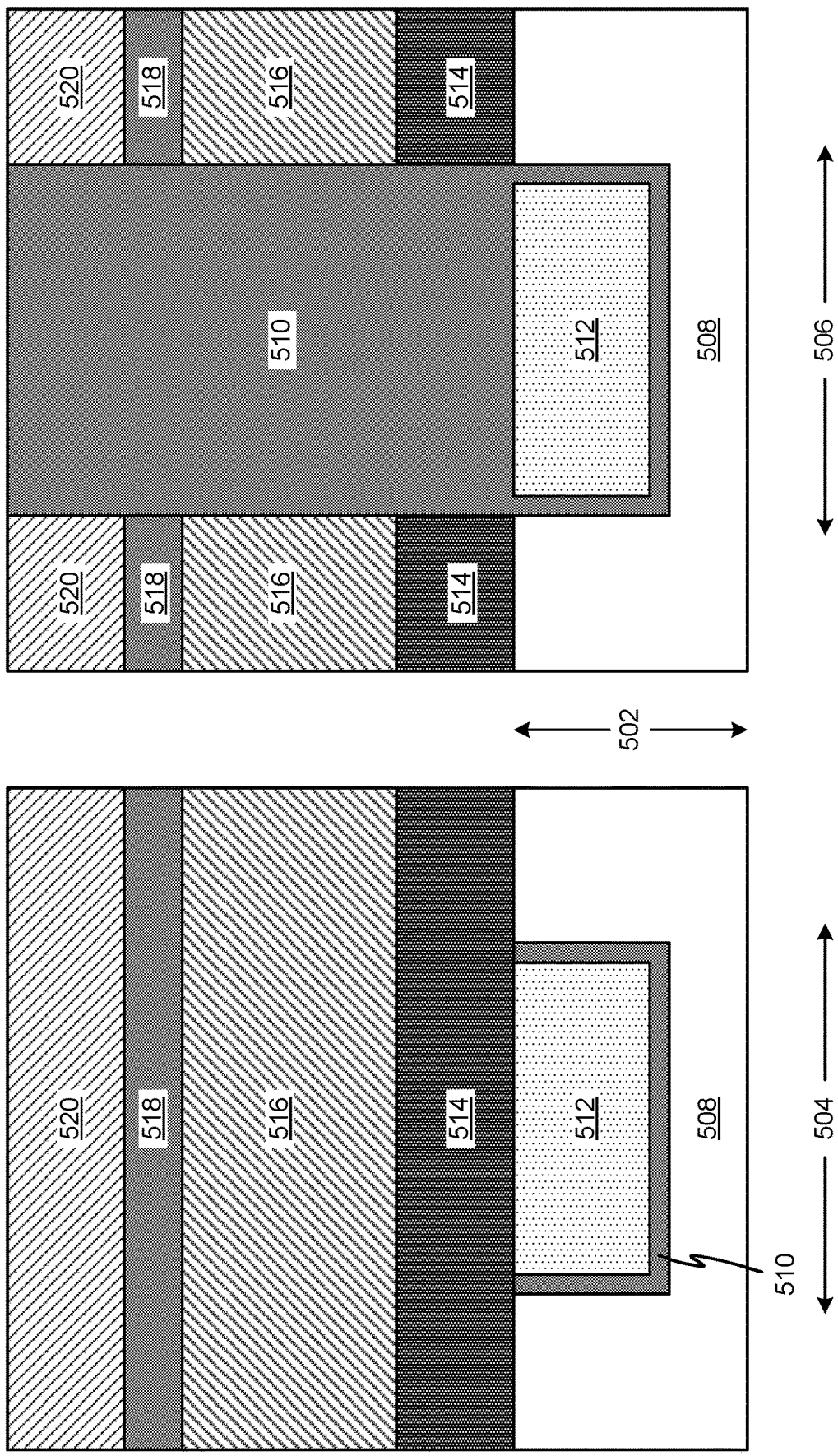
Figure 5E:
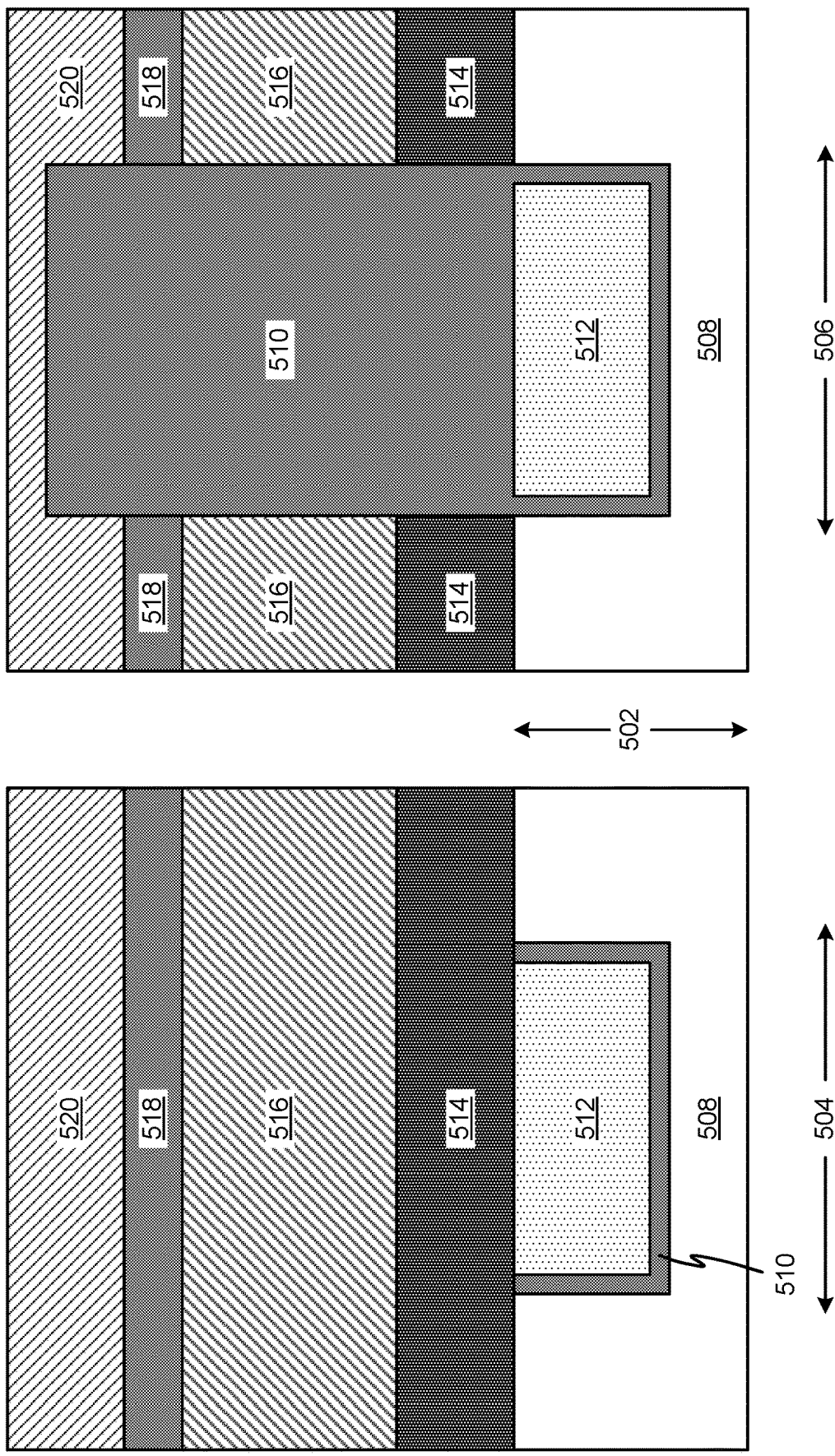

As shown in FIG. 5C, a buffer layer 514, a relaxed buffer layer 516, an oxide pad 518, and a nitride pad 520 are deposited full film above the existing structure in the film thickness direction 502. In FIG. 5D, an active mask is used to form a trench at the element width direction 506 in the right view down to an upper surface of the lower portion of the source line layer 512. Thereafter, additional oxide material is deposited in the trench to grow the first insulative layer 510 to a thickness that coincides with an upper surface of the nitride pad 520. Then, in FIG. 5E, the deposited oxide is nitridated using $NH_3$ plasma or a mixture of $N_2$ and $NH_3$ at low temperature (e.g., less than about 200° C.) to cover the first insulative layer 510 in the right view. Thick nitridation may not be possible because a good nitride film will act to block oxygen-nitrogen replacement therebelow (e.g., the nitride pad 520 will prevent oxygen diffusion through the nitride pad 520).

Figure 5F:
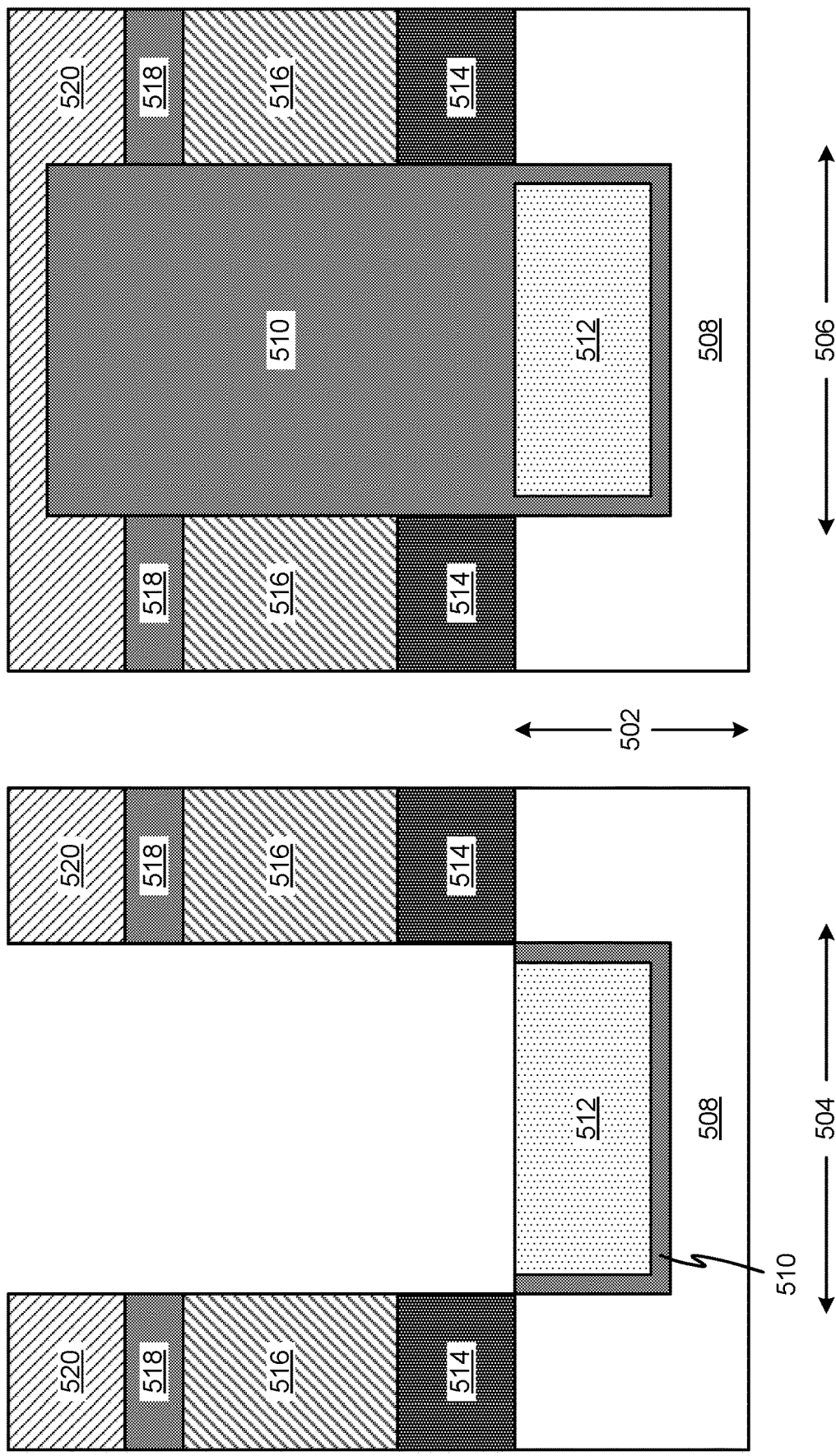
Figure 5G:
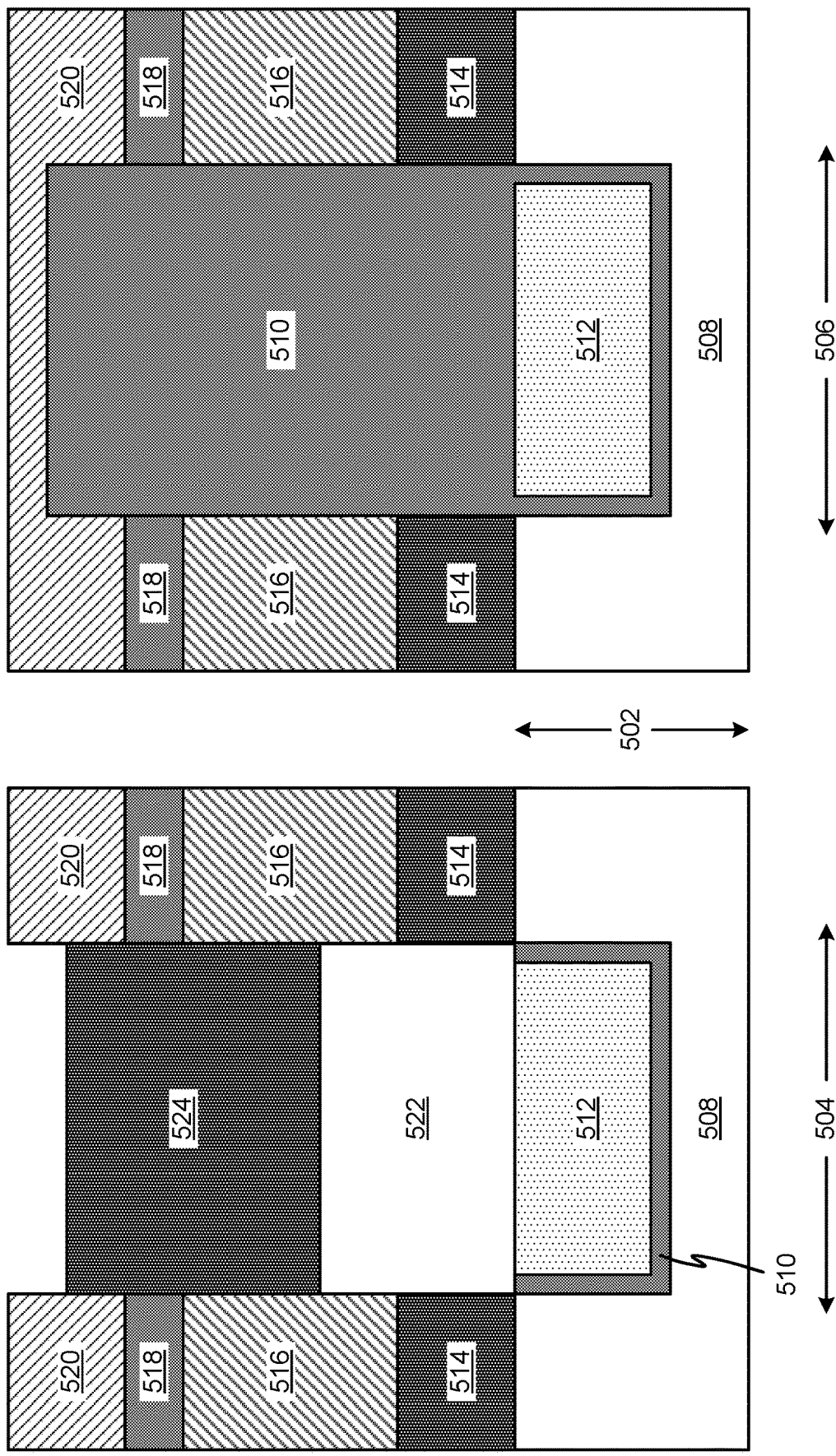
Figure 5H:
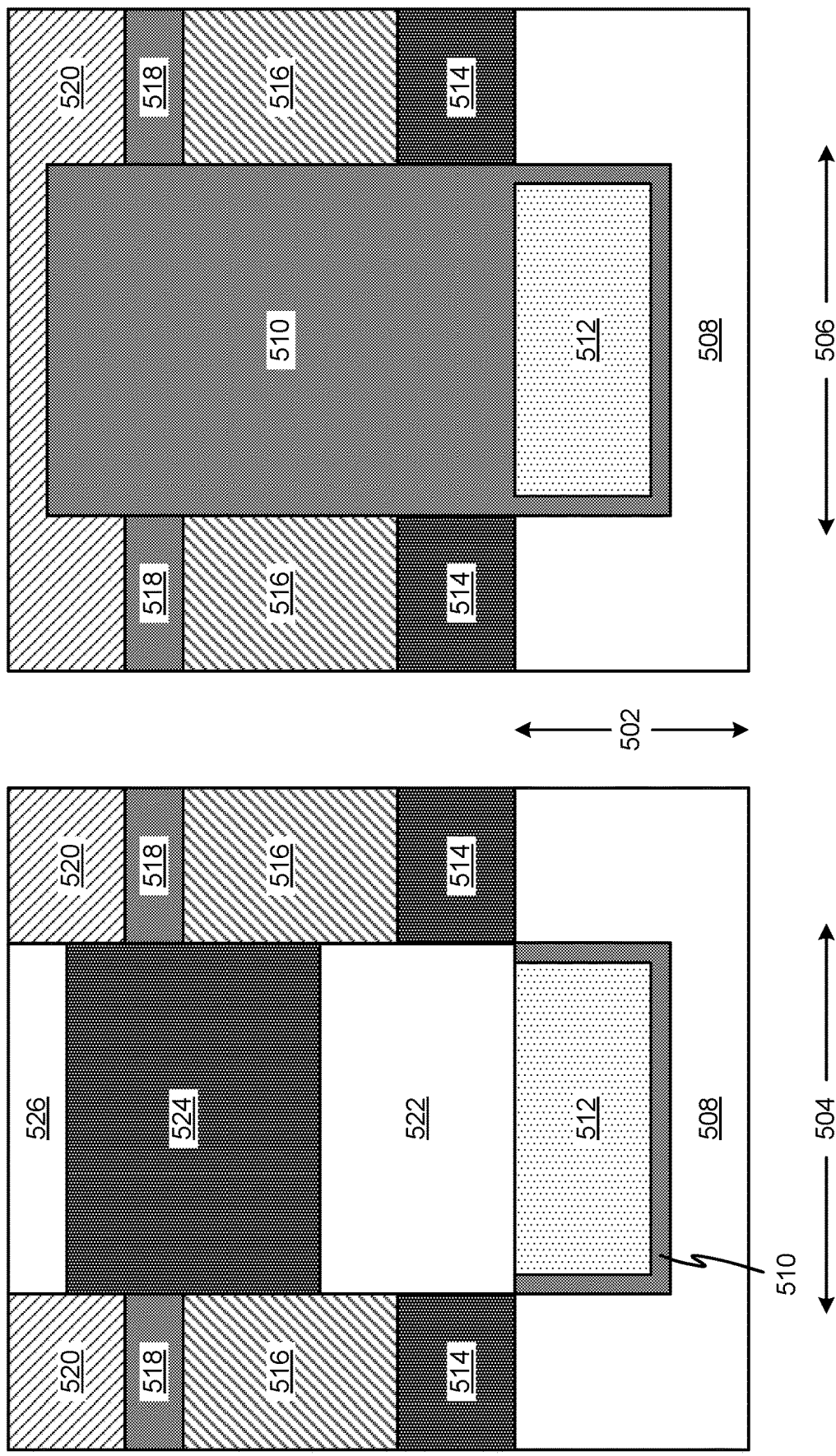
Figure 5I:
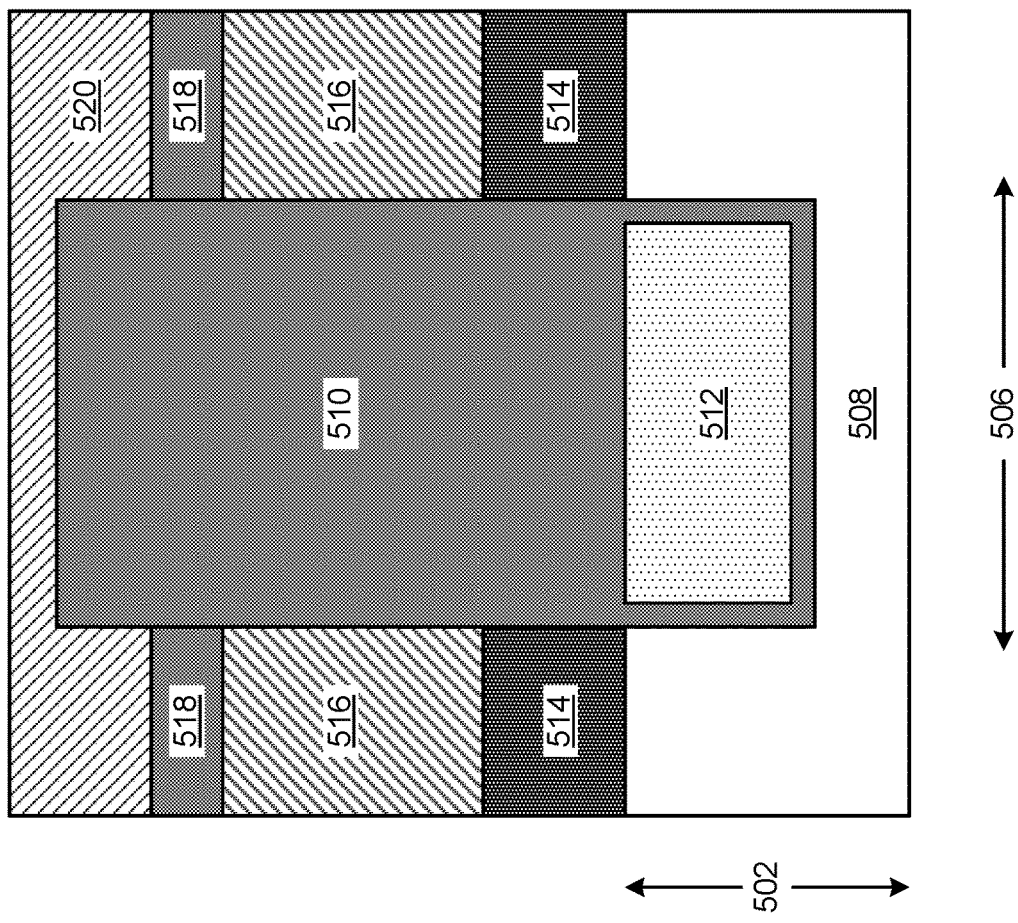
Figure 5I:
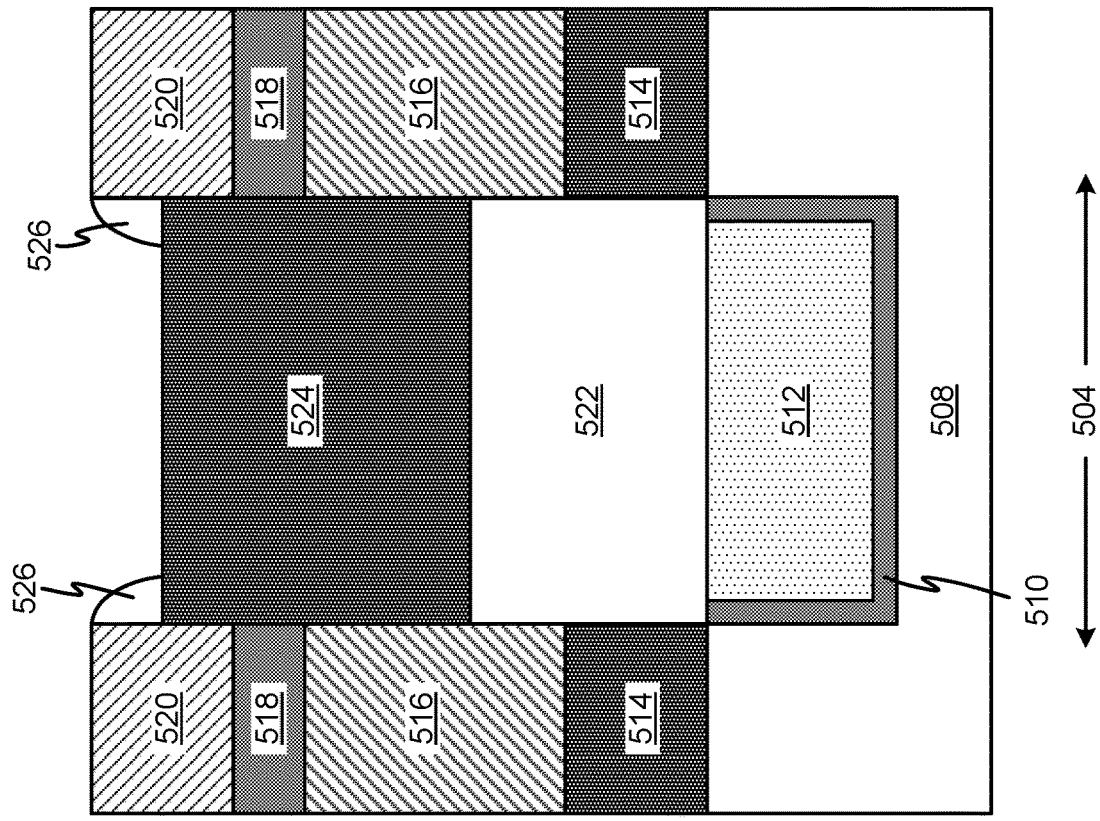

As shown in FIG. 5F, an active trench is defined in the left view down to a level that coincides with an upper surface of the source line layer 512. In FIG. 5G, a layer of P-doped polysilicon 522 is deposited above the source line layer 512, followed by a layer of undoped polysilicon 524 thereabove up to a level just below an upper surface of the nitride pad 520. Then, as shown in FIG. 5H, an Al layer 526 is deposited above the undoped polysilicon layer 524, and as shown in FIG. 5I, the Al layer 526 is anisotropically etched back to form a sidewall mask which reduce the hole size for subsequent formation operations.

A liquid mixture comprising phosphoric acid, nitric acid, acetic acid, and water may be used as an etching solution for Al or Al alloys in this approach. Conventional $CCl_4$ etch does not provide adequate etch-selectivity of Al over Si or $SiO_2$ for etching in this structure. However, $BCl_3$ demonstrates etch-selectivity of larger than 3 (Al/Si) and 10 (Al/$SiO_2$). This selectivity may be improved with optimization of partial pressure of etchant gas, temperature, plasma power, and electrode gap such that $BCl_3$ may be used as an etchant gas in addition to or in place of the liquid mixture under certain circumstances.

Figure 5J:
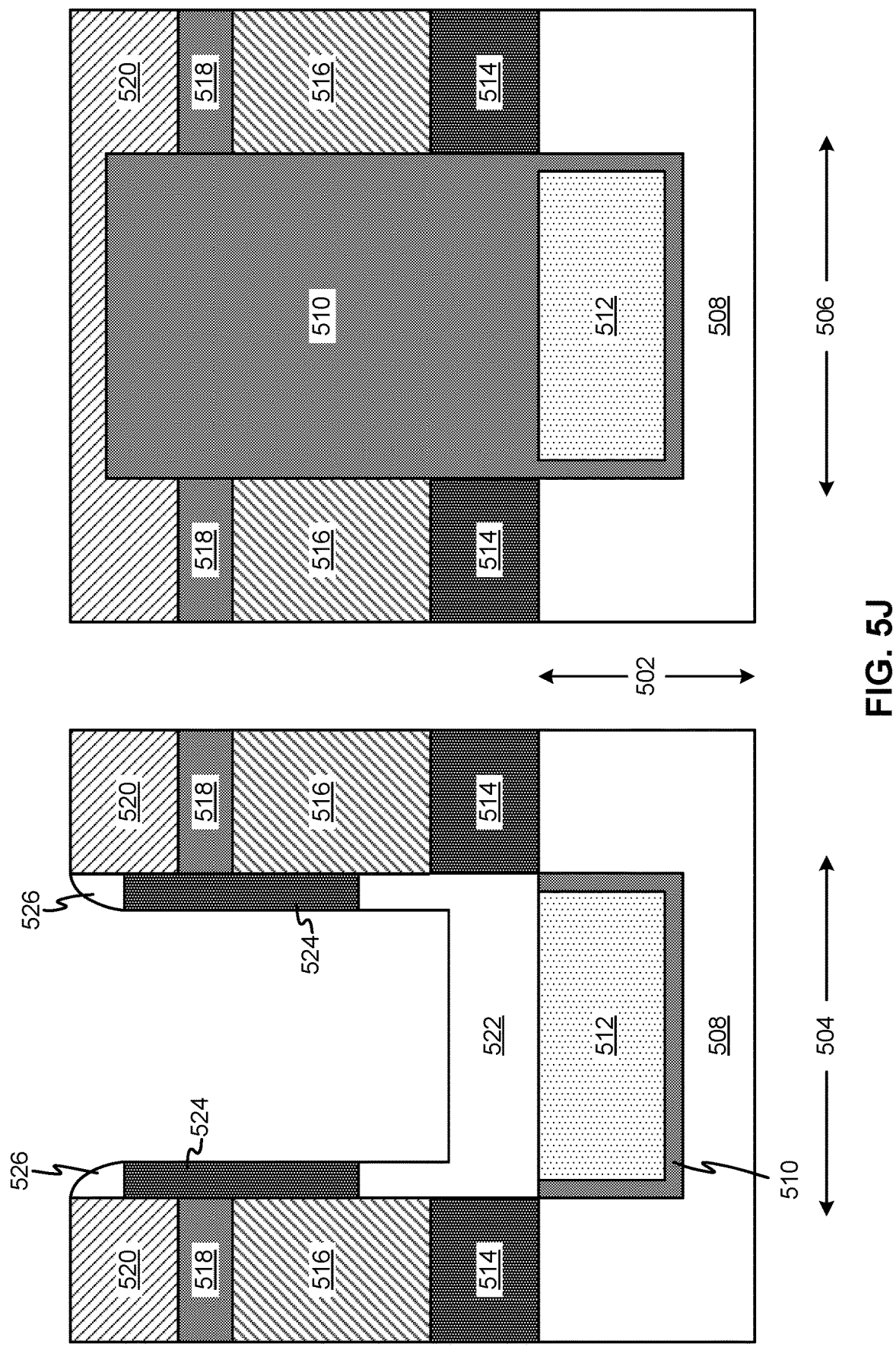
Figure 5K:
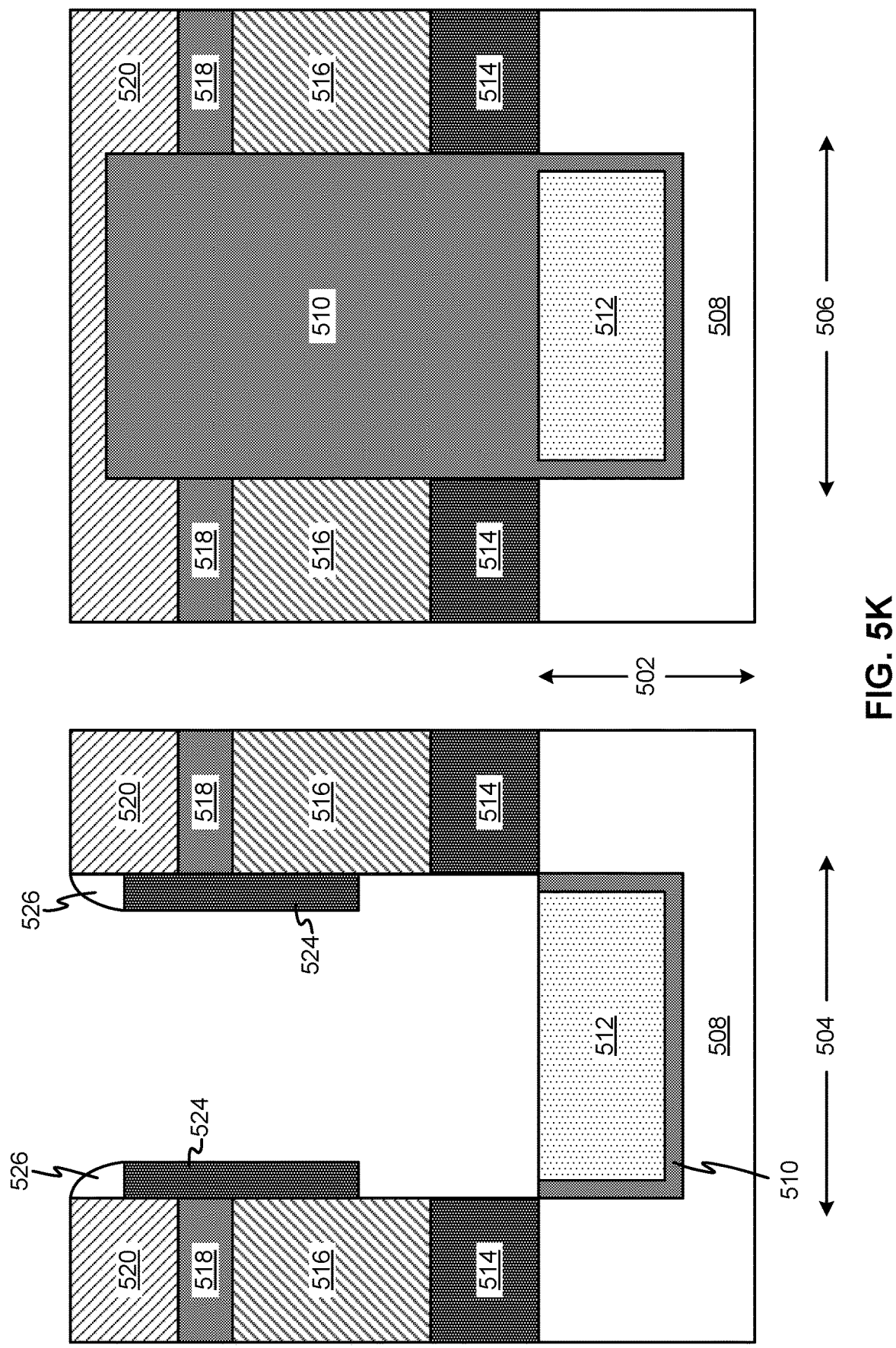

As shown in FIG. 5J, anisotropic etching is performed to open up the buried undoped polysilicon layer 524, in which a portion of the P-doped polysilicon layer 522 may also be etched away. In one embodiment, $SF_6$ may be employed for the anisotropic etching of Si using the Al sidewall mask. As shown in FIG. 5K, the P-doped polysilicon layer 522 is selectively etched away exposing an upper portion of the source line layer 512. Selectively removing p-doped polysilicon may be performed, in one approach, by heating to about 650° C. for approximately 30-60 min, annealing in $N_2$ ambient, and then etching selectively at about a 60-80:1 ratio in $HNO_3/CH_3COOH/HF/DI$ solution.

Figure 5L:
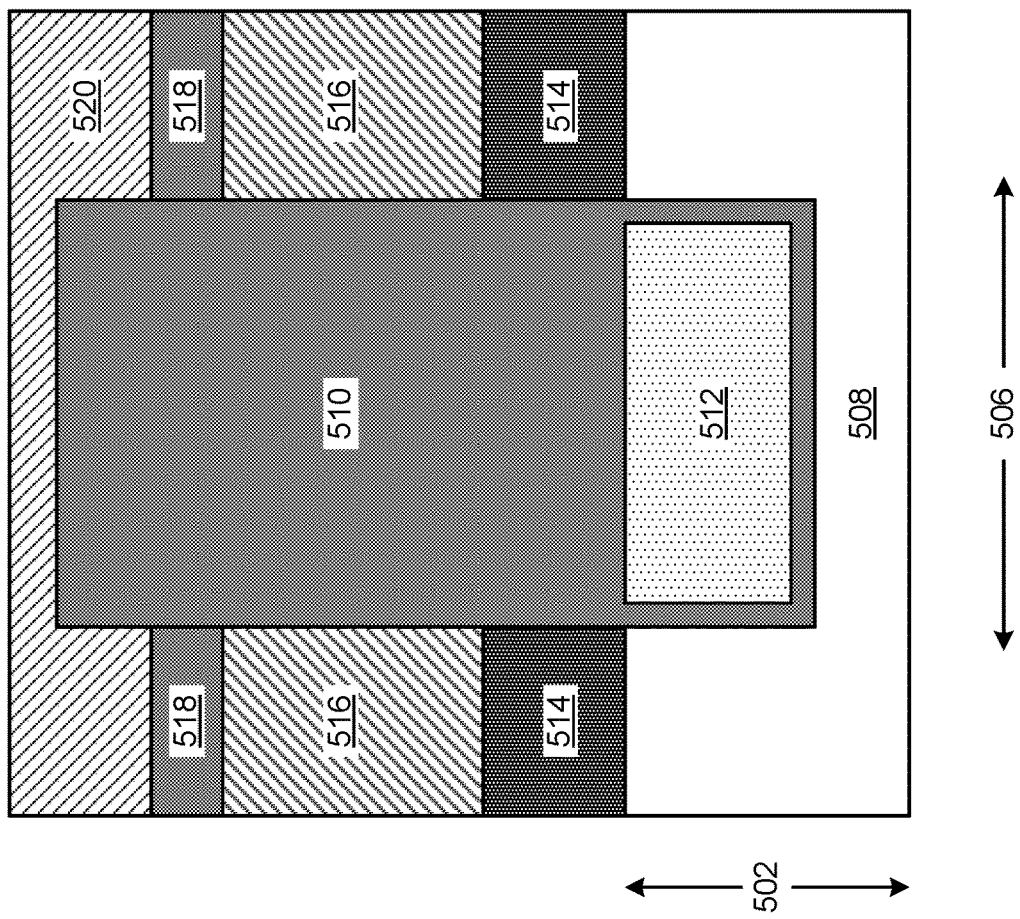
Figure 5L:
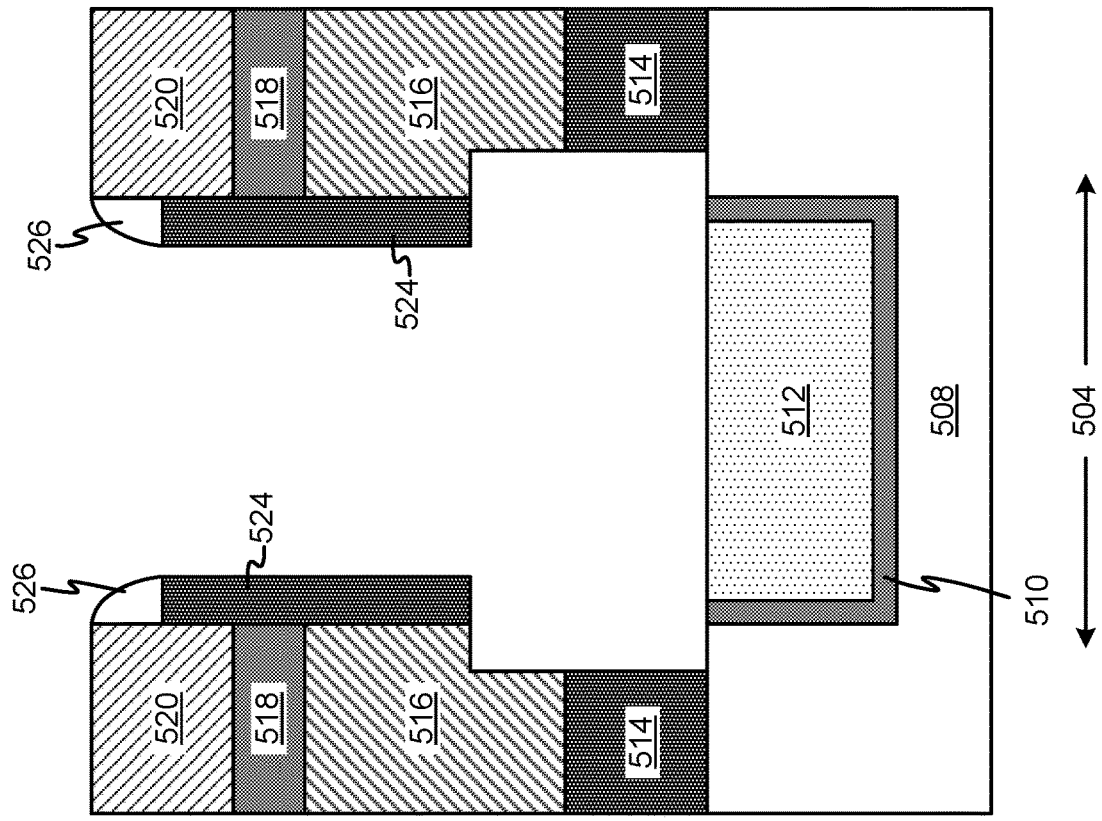
Figure 5M:
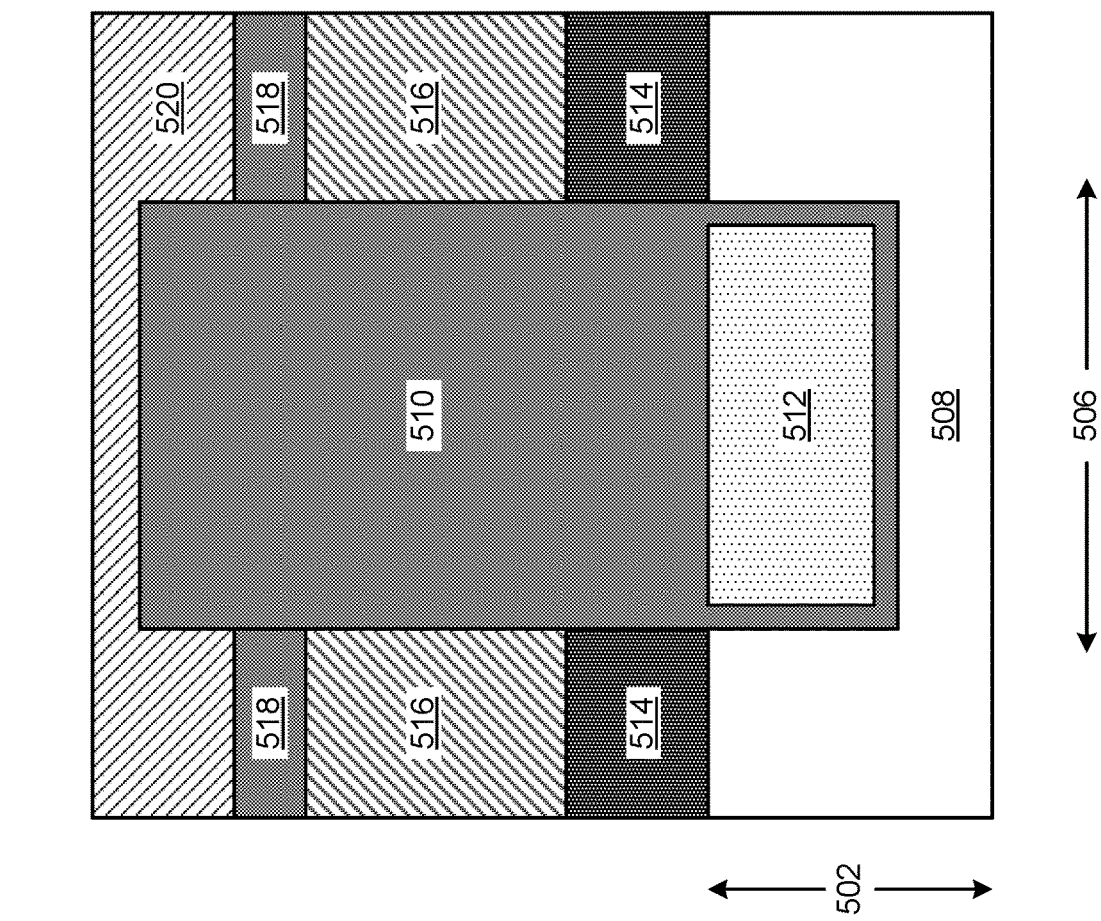
Figure 5M:
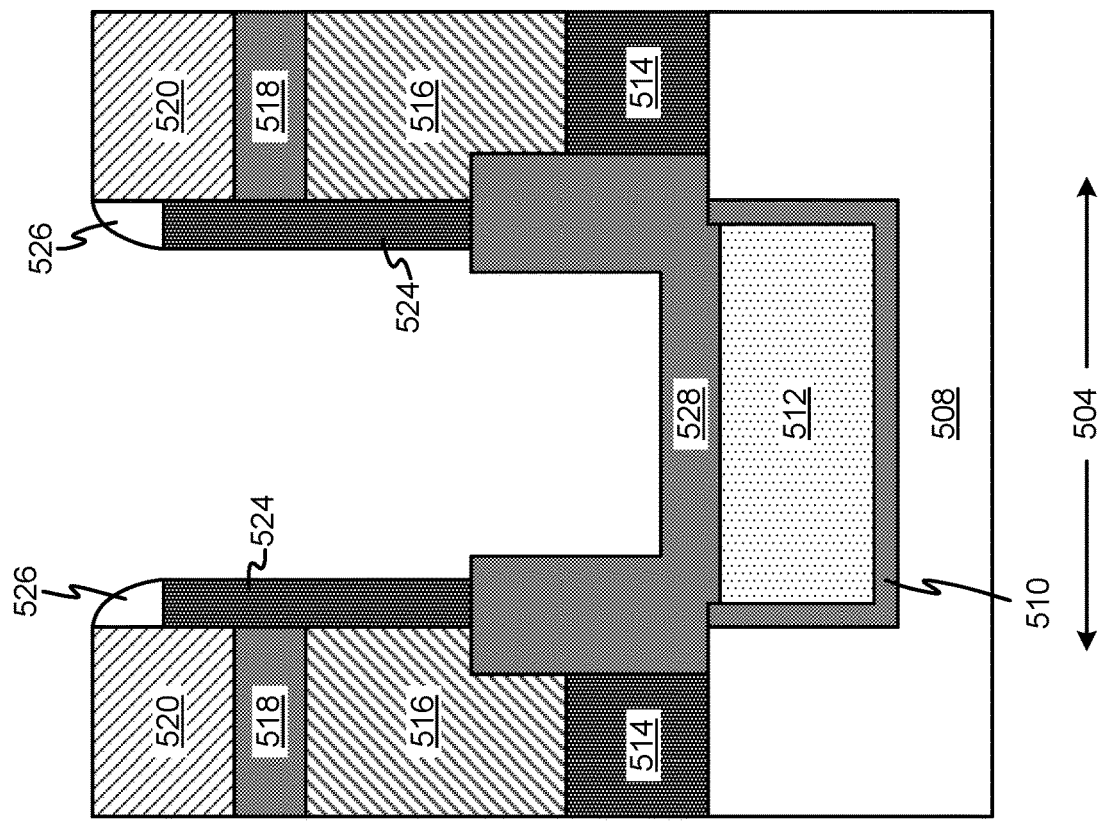
Figure 5N:
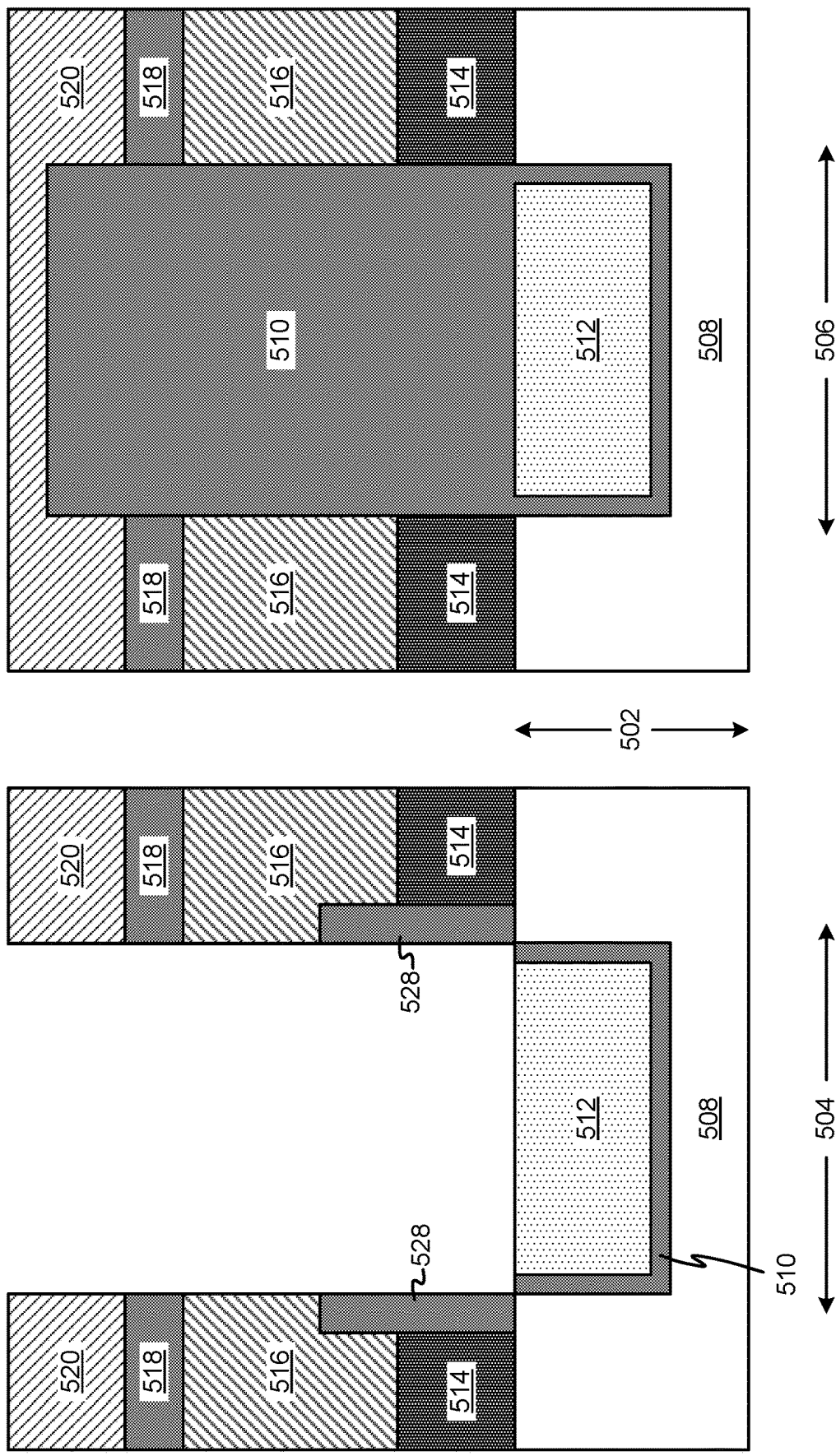

As shown in FIG. 5L, sidewalls of the buffer layer 514 and the relaxed buffer layer 516 may be etched away. In an alternate embodiment, no etching is performed, and instead collar oxidation is performed to grow oxides from the materials of the buffer layer 514 and the relaxed buffer layer 516, as shown in FIG. 5M. If etching is performed, then the oxide layer 528 is deposited after the etching is performed. Then, as shown in FIG. 5N, the Al sidewall mask 526 is removed, such as by using an Al etchant, and a deep trench etch is performed to clean up the collar oxide 528 and the remaining sidewall portions of the undoped polysilicon layer 524.

Figure 5O:
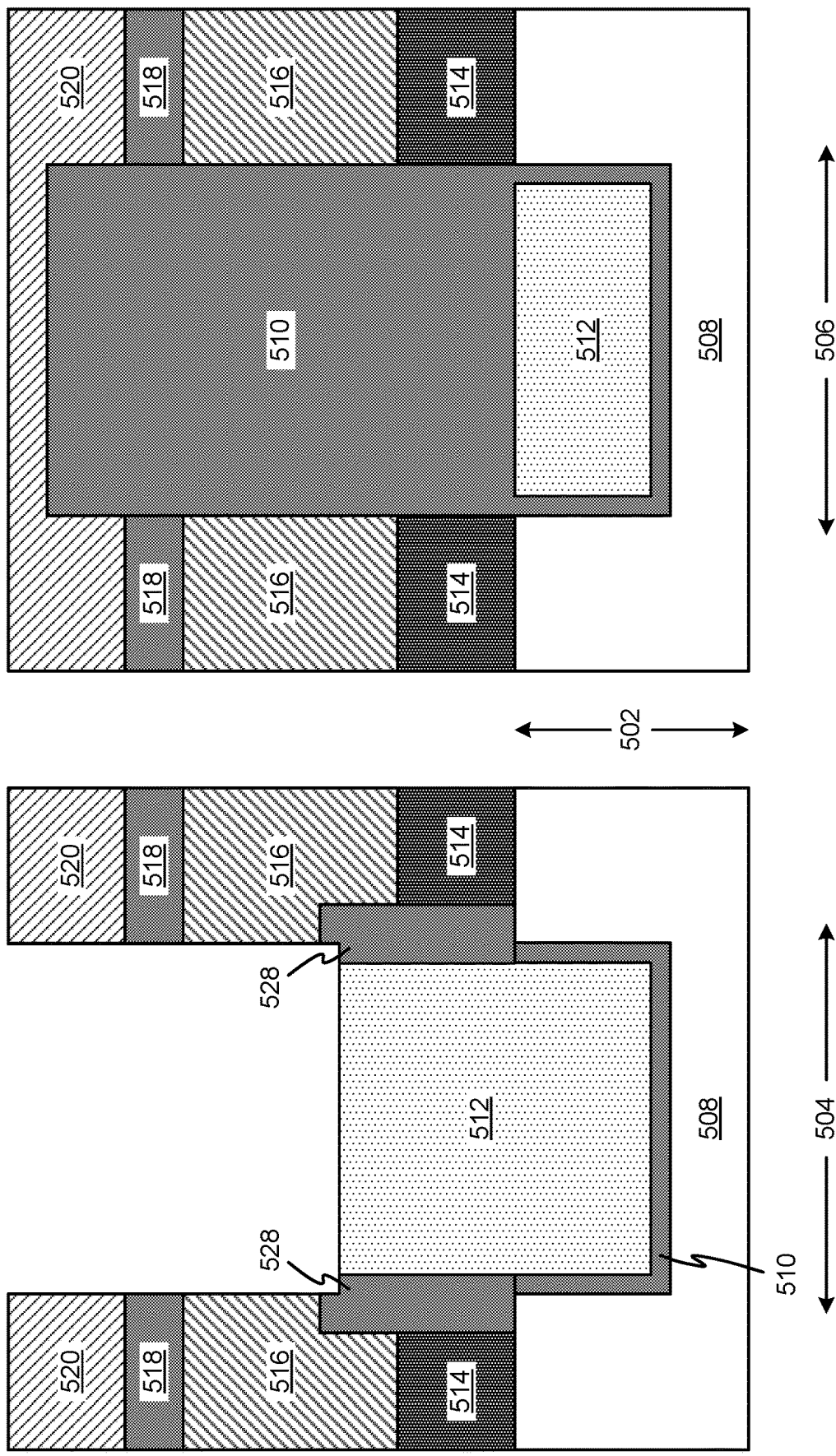
Figure 5P:
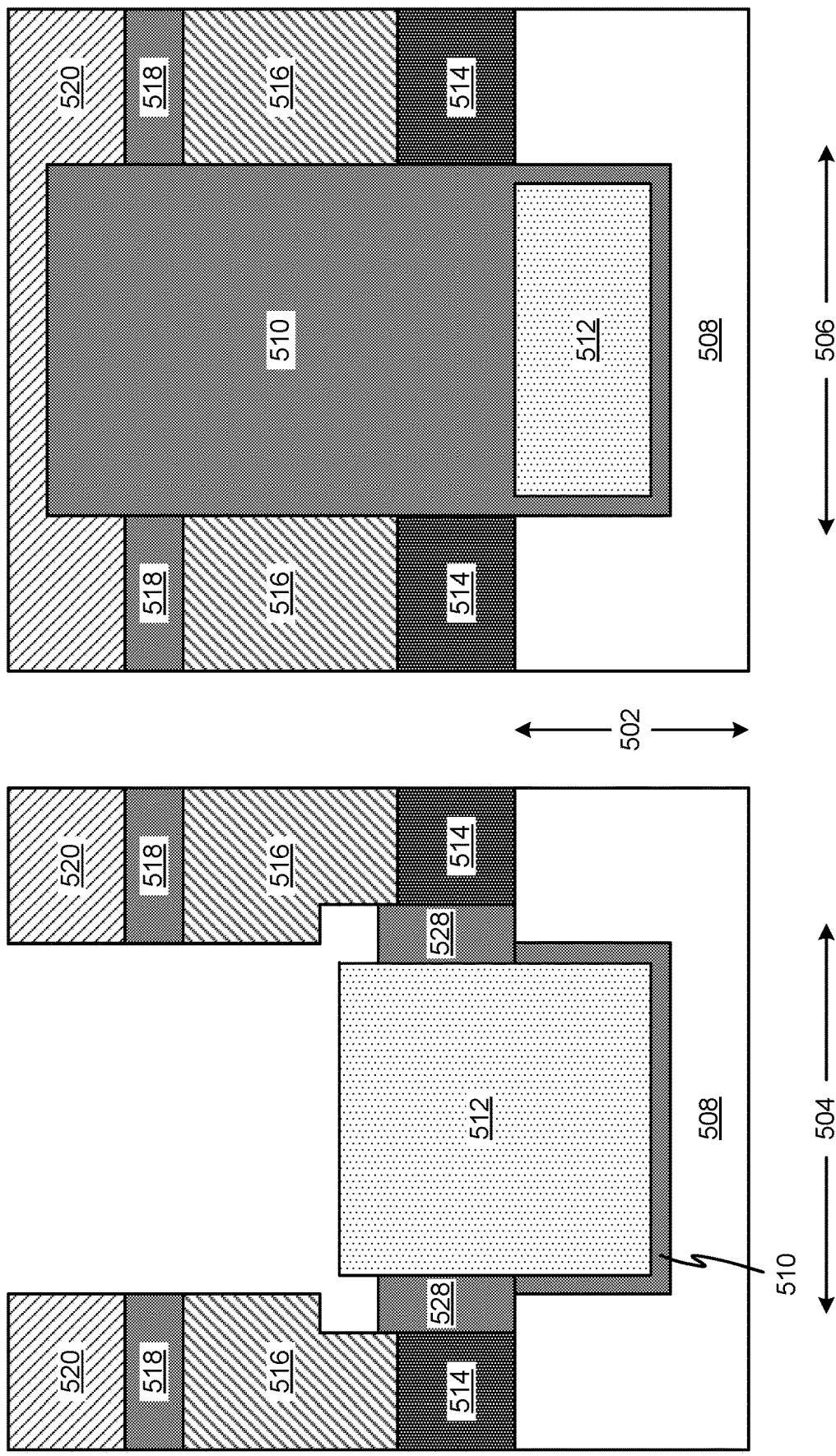

Then, as shown in FIG. 5O, additional material is deposited to grow the source line layer 512, with possible growing of the oxide layer 528 during the process (such as in response to the source line layer being a polysilicon material). Then, in FIG. 5P, portions of the oxide layer 528 are removed from sides of the source line layer 512. In one embodiment, oxide is removed (such as via etching) to form a liner void. Possible etching processes may make use of HF, BHF wet etchant, or use a gas mixture of $NH_3$ and $NF_3$ or $CF_4$ and $O_2$ mixed with $H_2$ and $N_2$ for a dry etch.

Figure 5Q:
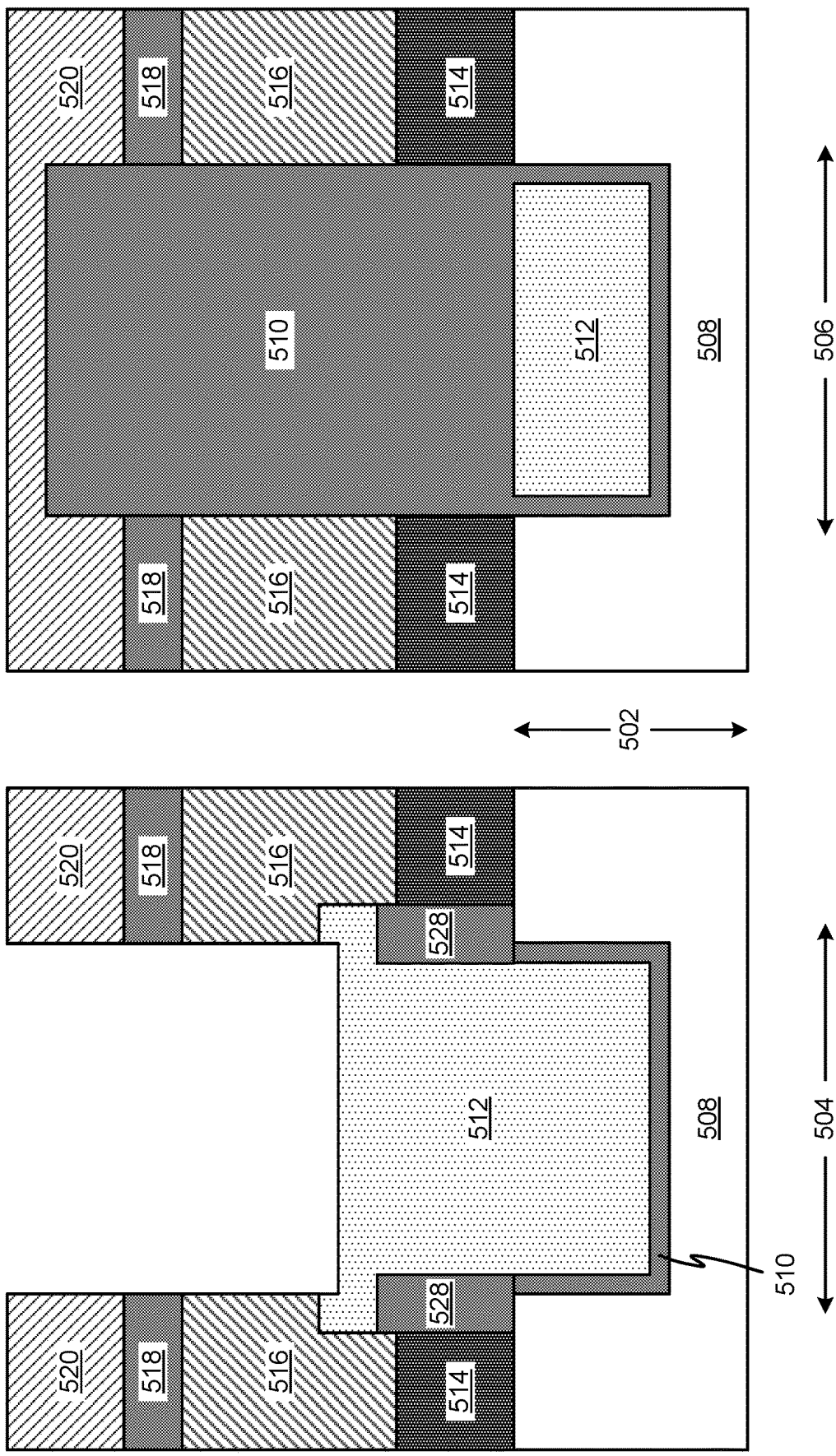
Figure 5R:
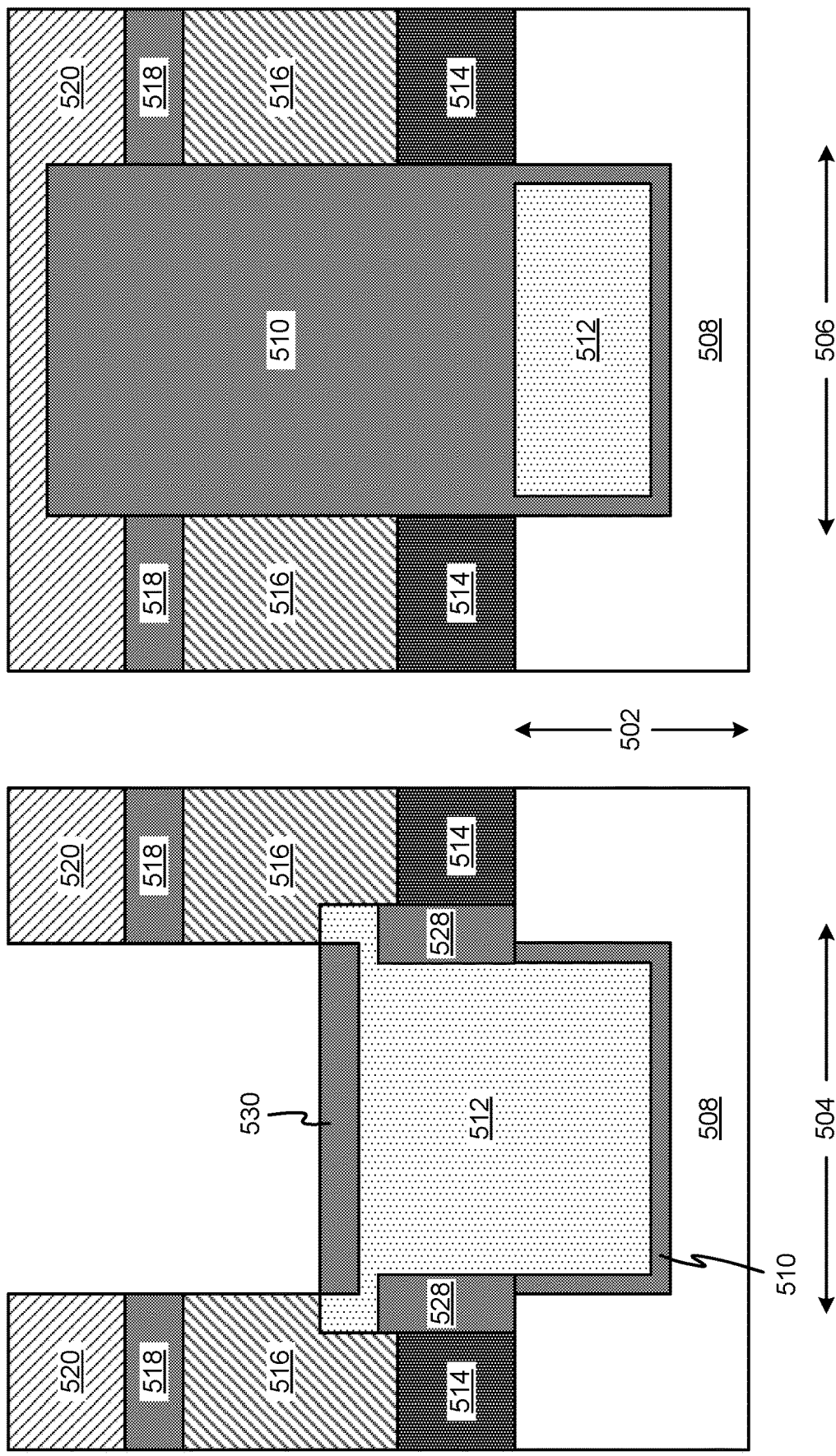

As shown in FIG. 5Q, additional material is deposited to grow the source line layer 512, and fill in the liner void created in the prior step. In one approach, a recess etch may be performed to reduce a thickness of a central portion of the source line layer 512. Then, as shown in FIG. 5R, a gate dielectric layer 530 is deposited above the source line layer 512 that separates the source line layer 512 and subsequently formed gate terminal (this process may use planarization and recess etching).

Figure 5S:
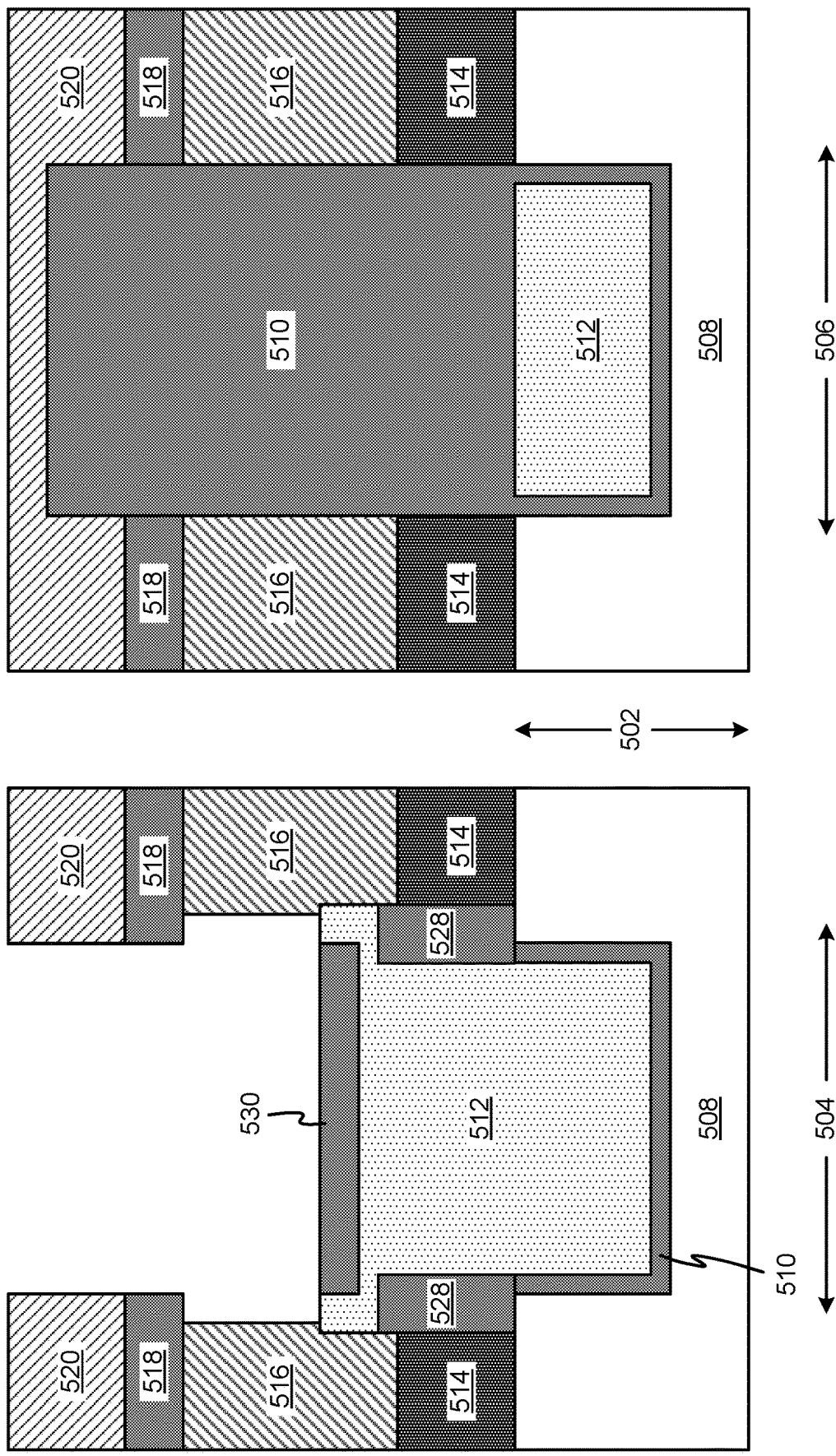
Figure 5T:
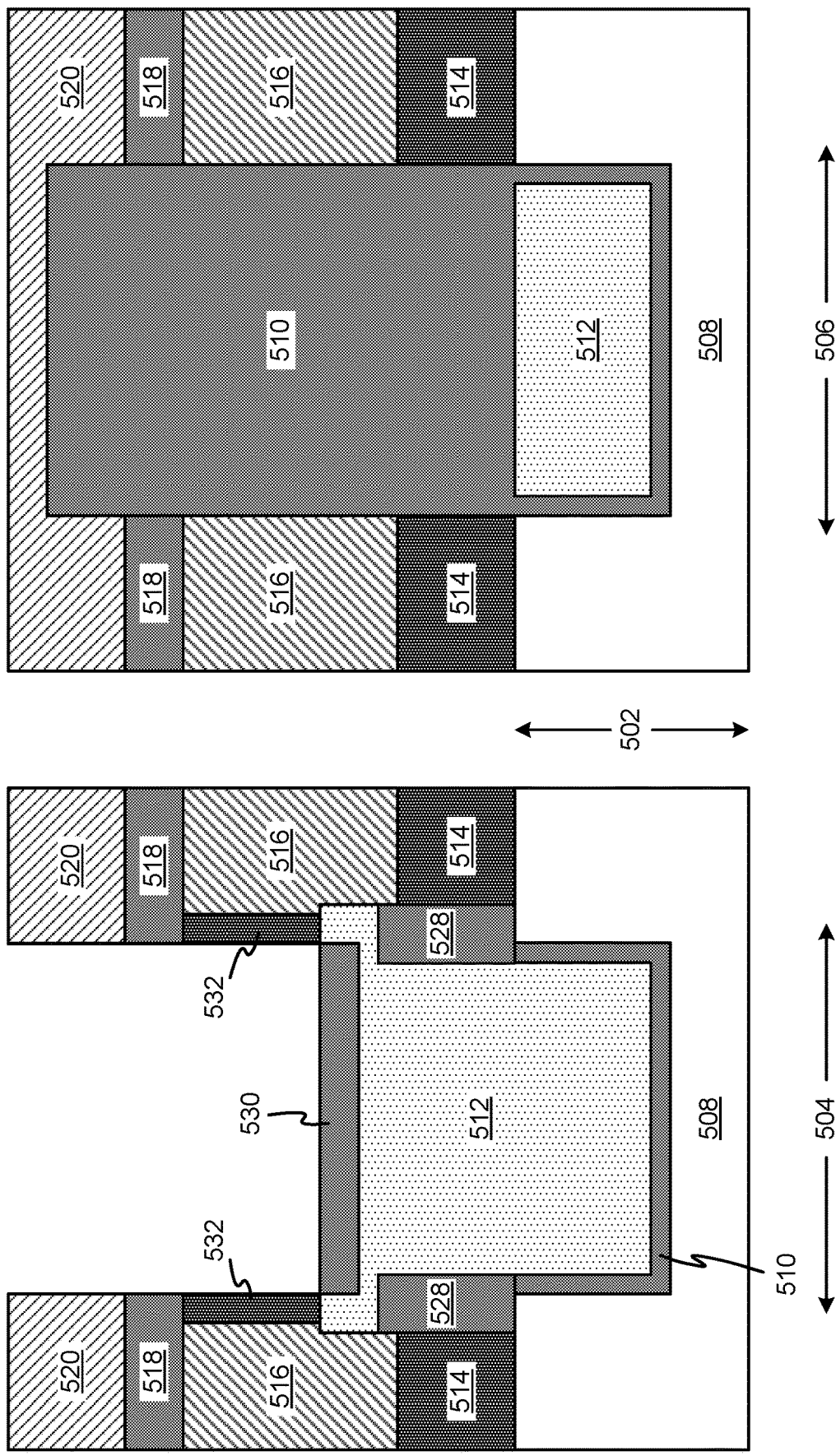

In FIG. 5S, the buffer layer 516 is recess etched (relying on differences in binding energies of Si—Si and Si—Ge, 2.31 eV and 2.12 eV, respectively). Once the Si—Ge bond is broken in the buffer layer 516 material, Si—Fe bonds and/or Ge—F bonds are readily created and become volatile $SiF_x$ and $GeF_y$. Selectivity of SiGe:Si of 60:1 is achieved using pure $CF_4$ etchant gas. Then, as shown in FIG. 5T, strained vertical Si channels which form the drain terminal 532 are grown on sides of the buffer layer 516. This is possible using the ASM Epsilon reactor with a three-step growth process known in the art, and/or using the Applied Materials® Centura® RP Epi system.

Figure 5U:
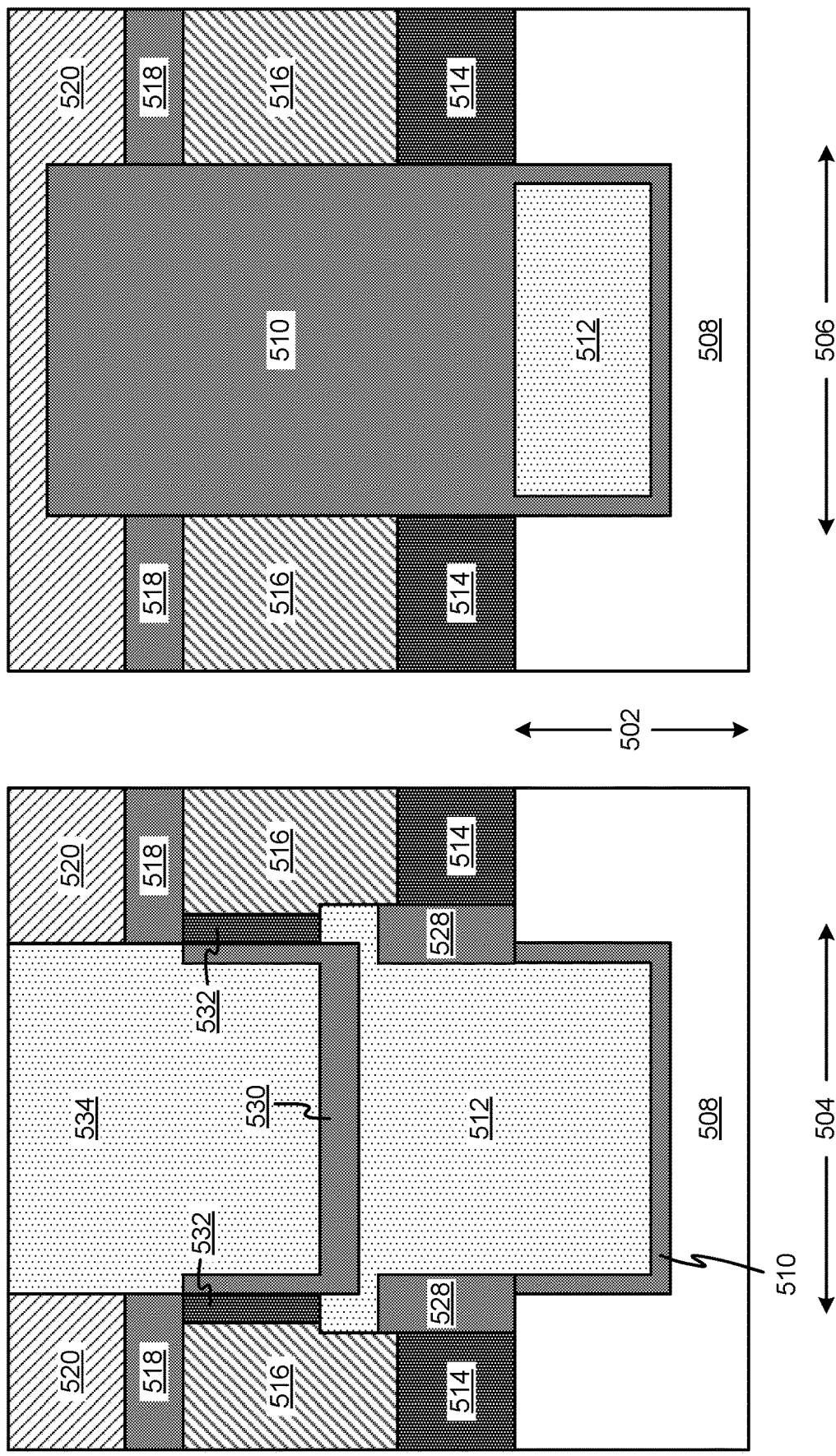
Figure 5V:
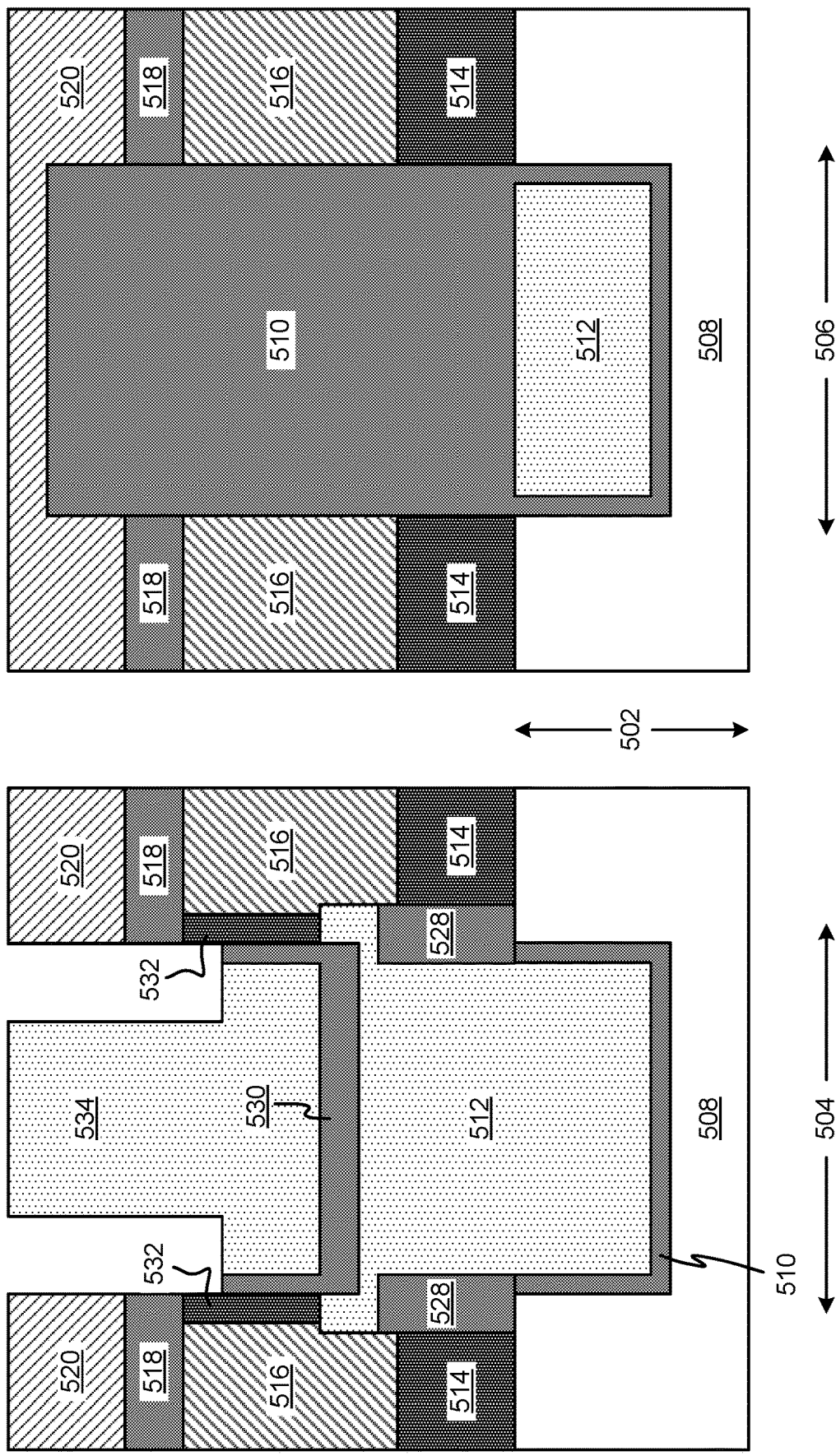
Figure 5W:
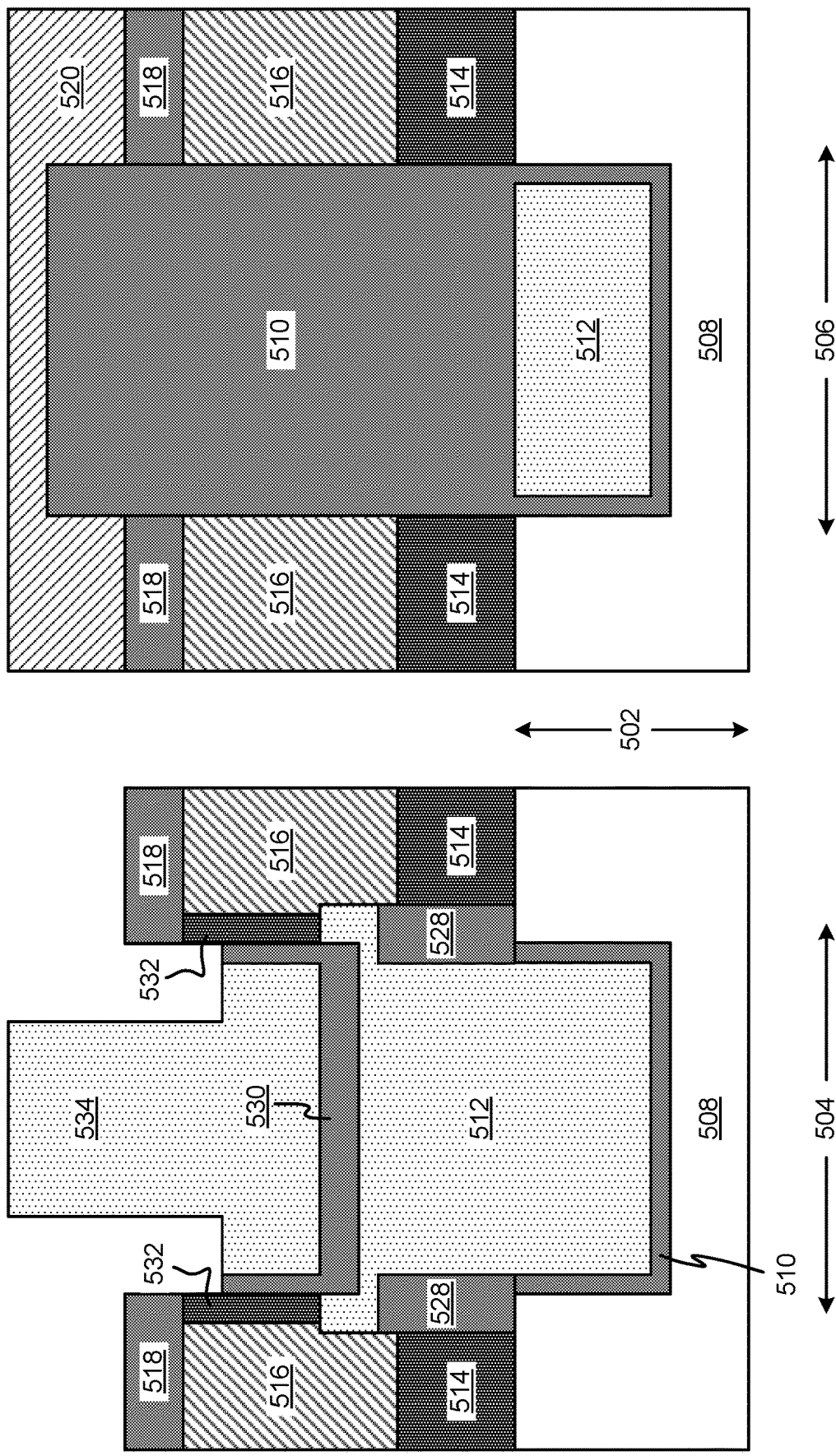

In FIG. 5U, a dielectric material is grown at the sides of the drain terminal 532 to extend the gate dielectric layer 530 upward along the sides of the drain terminal, then a gate terminal 534 is formed, such as by depositing the material and then planarizing to a level of the upper surface of the nitride pad 520. As shown in FIG. 5V, portions of the gate terminal 534 are recess etched for drain formation. In an alternate embodiment, the gate/drain overlap length is adjusted. Using a gate contact mask with inverted photoresist polarity, an etch mask is patterned. Extreme etch selectivity of over 500:1 ($polySi:Si_3N_4$) is possible. The etch reaction may be carried out using a combination of $H_2$ and a fluorinated species, such as nitrogen trifluoride ($NF_3$) or carbon tetrafluoride ($CF_4$). This forms an inverted T-shape when viewed in cross-section for the gate terminal 534. This also exposes upper portions of the drain terminal 532. Thereafter, as shown in FIG. 5W, the nitride pad 520 is removed. In one embodiment, the nitride pad 520 may be removed by hot phosphoric acid at 160° C. (hot phosphoric acid hydrolyzes the nitride to some form of hydrous silica and ammonia, and the activation energy for the reaction is 0.55 eV for silicon nitride, 1.20 eV for silicon dioxide, and 1.15 eV for silicon. Thereafter, drain junction doping may be performed with n+ implantation.

Figure 5X:
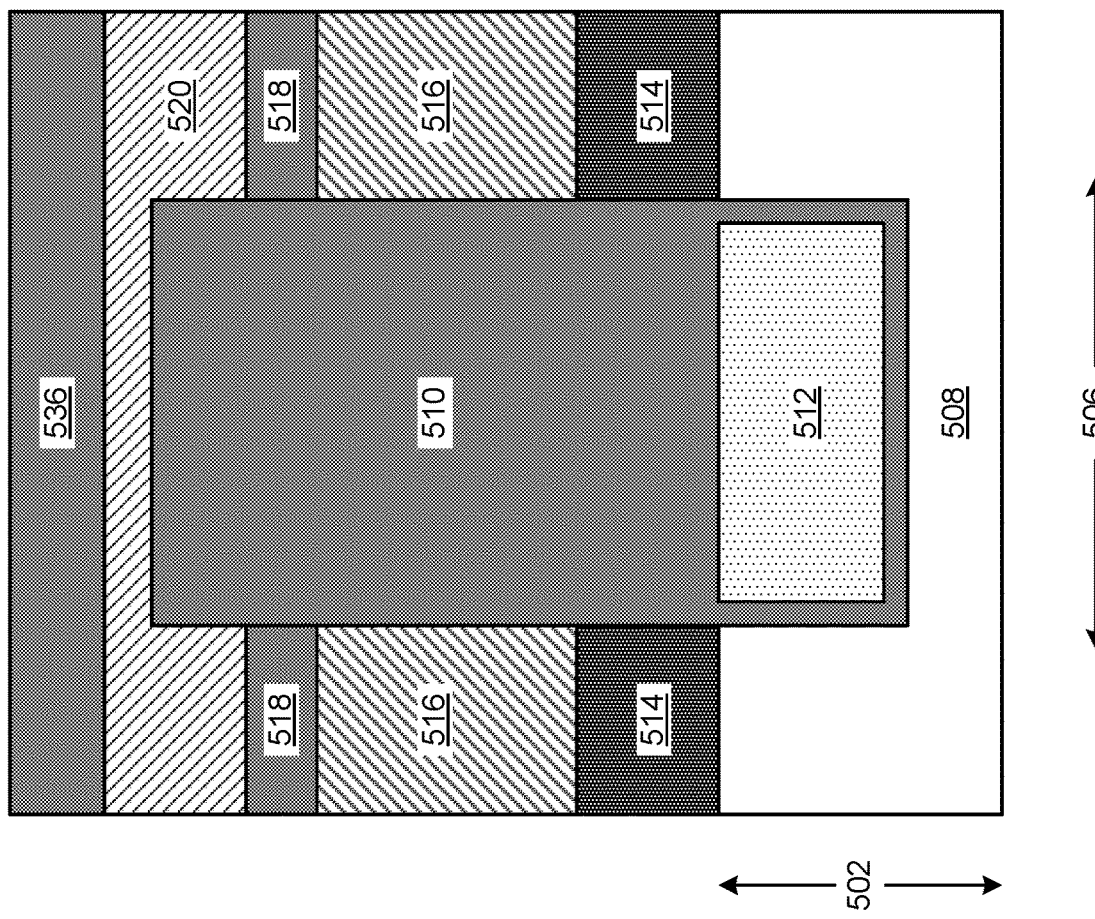
Figure 5X:
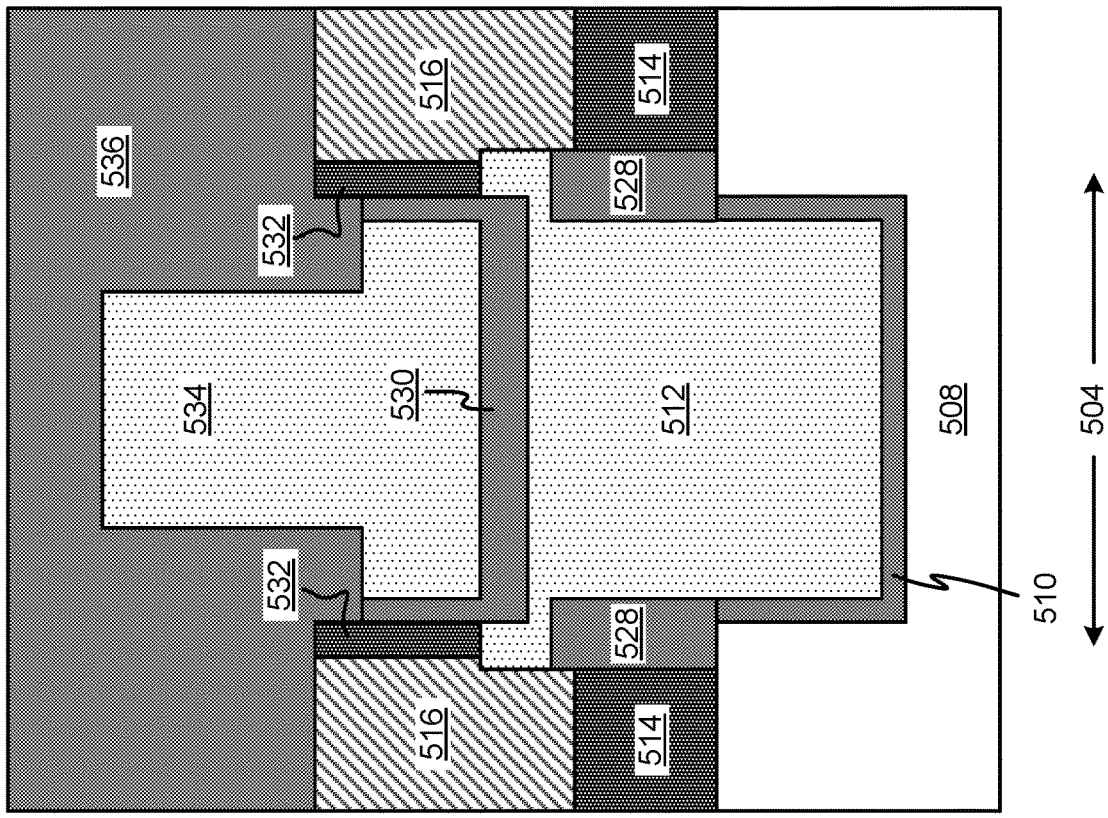
Figure 5Y:
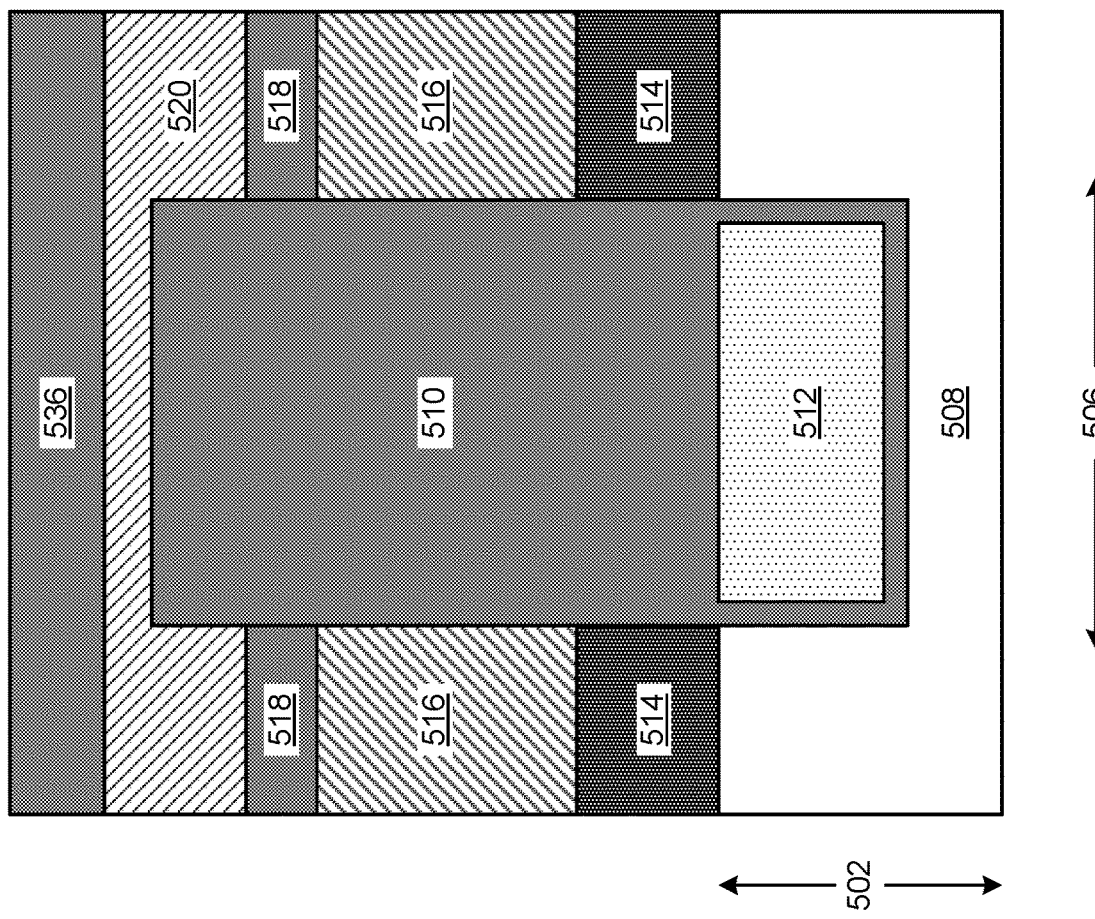
Figure 5Y:
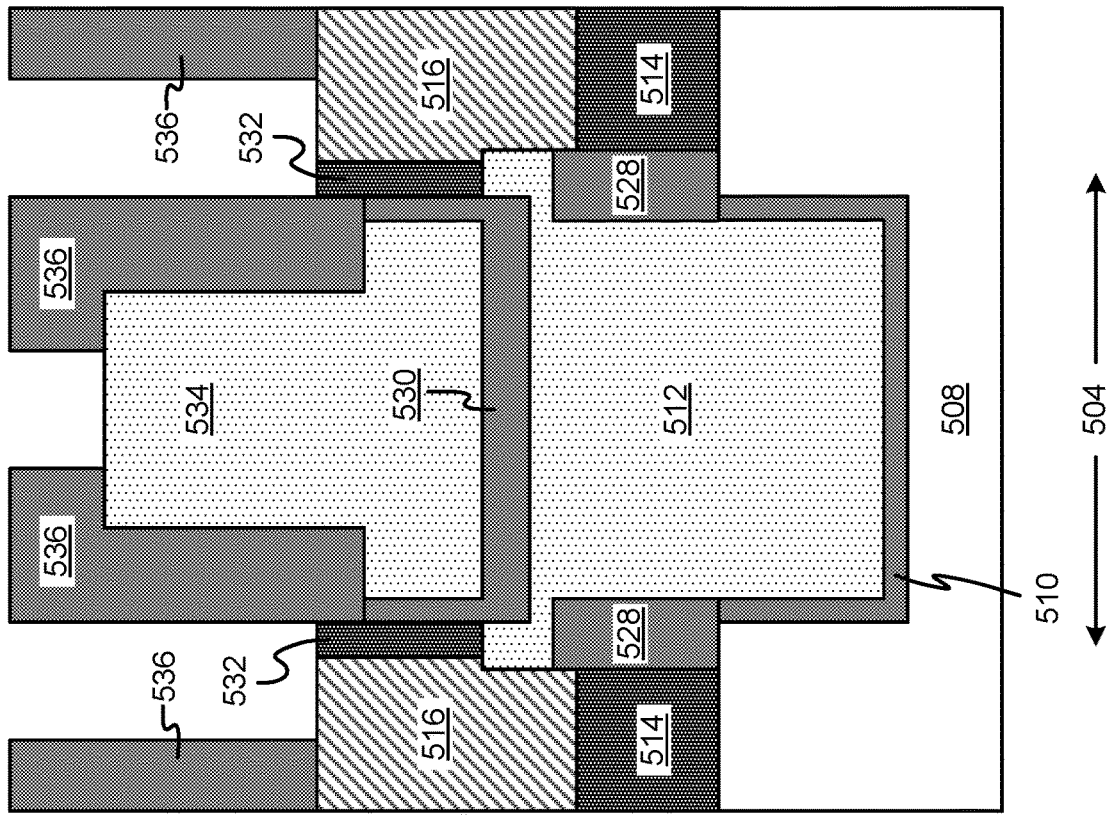
Figure 5Z:
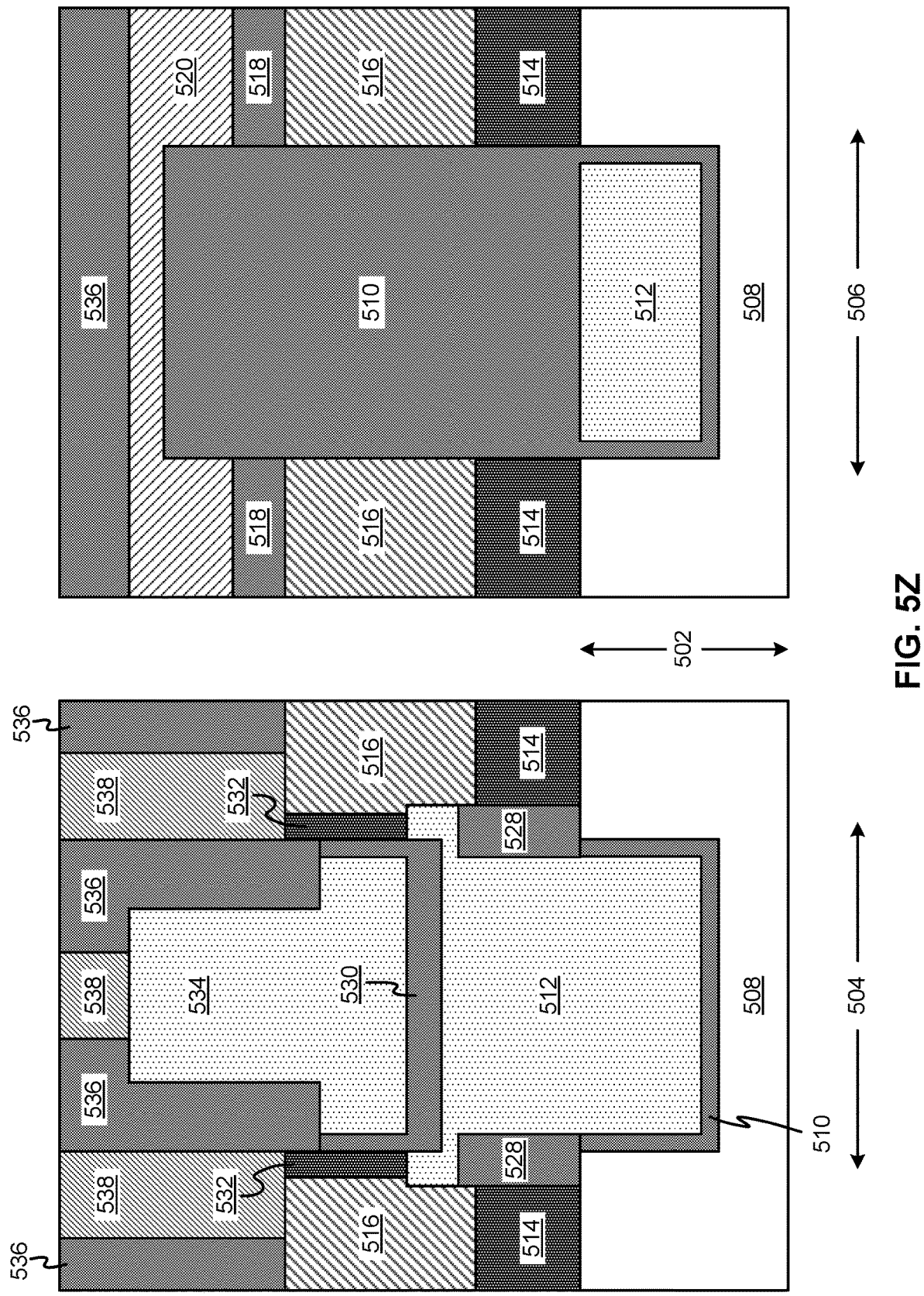
Figure 5A:
Figure 5B:
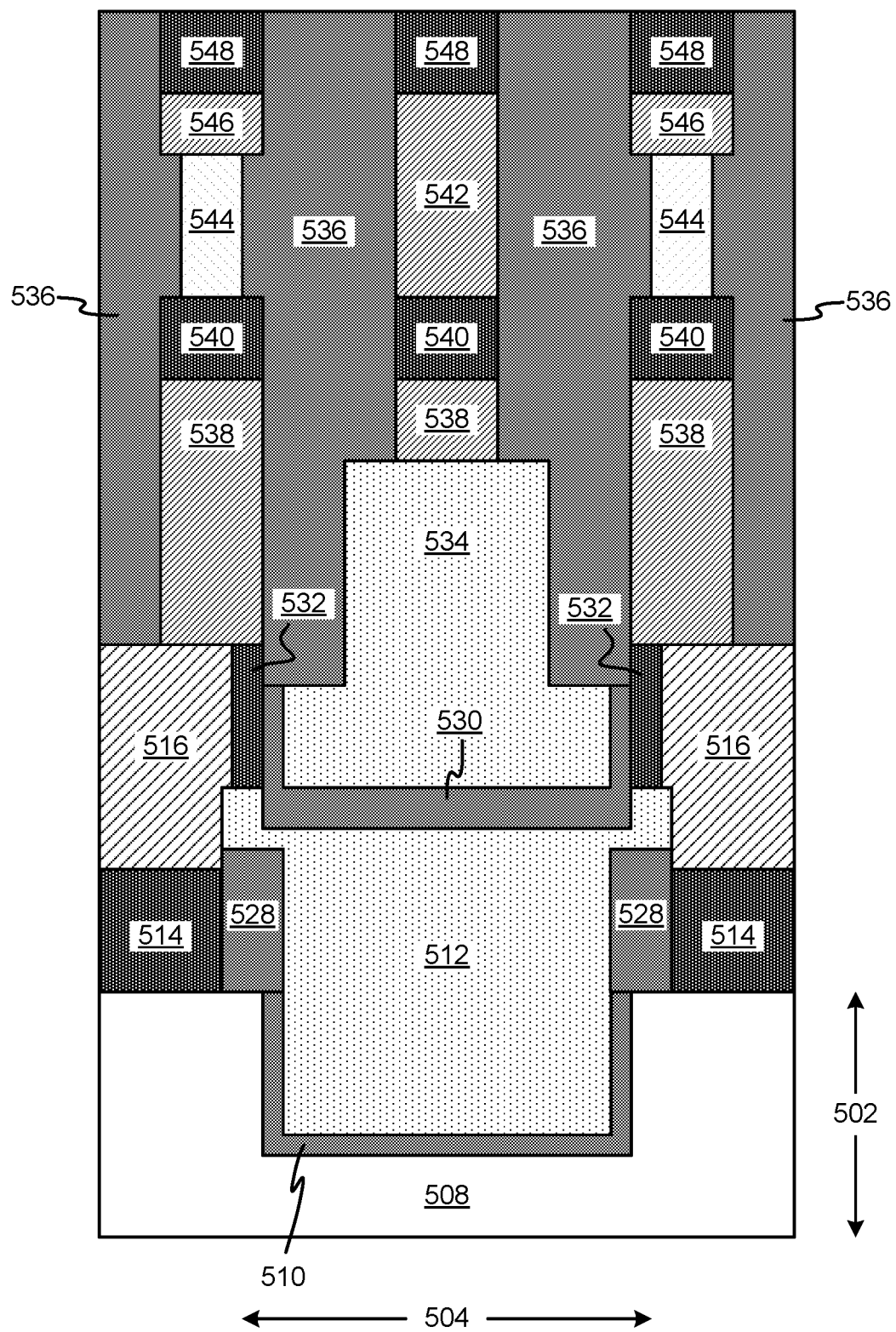
Figure 5C:
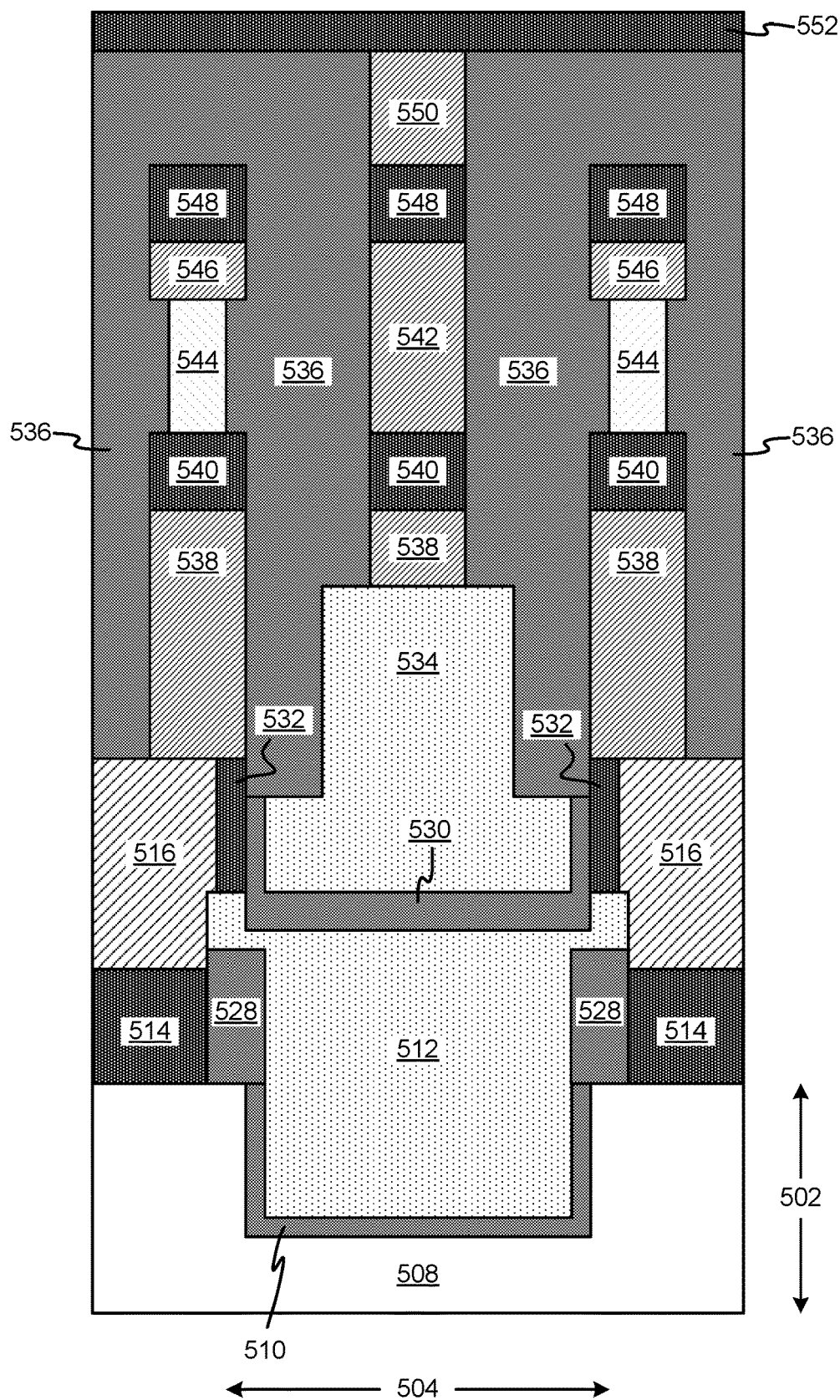

As shown in FIG. 5X, a second insulative layer 536 is formed above the existing structure. Then, as shown in FIG. 5Y, using one of two different contact masks, a drain contacts are formed on both sides of the gate terminal 534 in the element width direction 504, and then a gate contact is formed above the gate terminal 534. In an alternate embodiment, the gate contact is formed first, followed by the two drain contacts. As shown in FIG. 5Z, two side vias and a central via (the vias 538) are formed in the corresponding drain or gate contact channels. As shown in FIG. 5AA, electrodes 540 are formed above the vias 538. Thereafter, as shown in FIG. 5BB, pMTJS 544 are formed above the outside electrodes 540, a second via 542 is formed above the central electrode 540, followed by bit line layers 548. The second insulative layer 536 is grown along with the various additional elements that are formed up each of the pillars.

As shown in FIG. 5CC, additional insulative material is added to the second insulative layer 536, and a third via 450 is deposited above the central bit line layer 548, followed by a word line layer 552 above the planarized second insulative layer 536 and the third via 450.

Each of the various layers described in FIGS. 5A-5CC may have materials similar to those described in FIG. 4, in various embodiments.

Figure 6A:
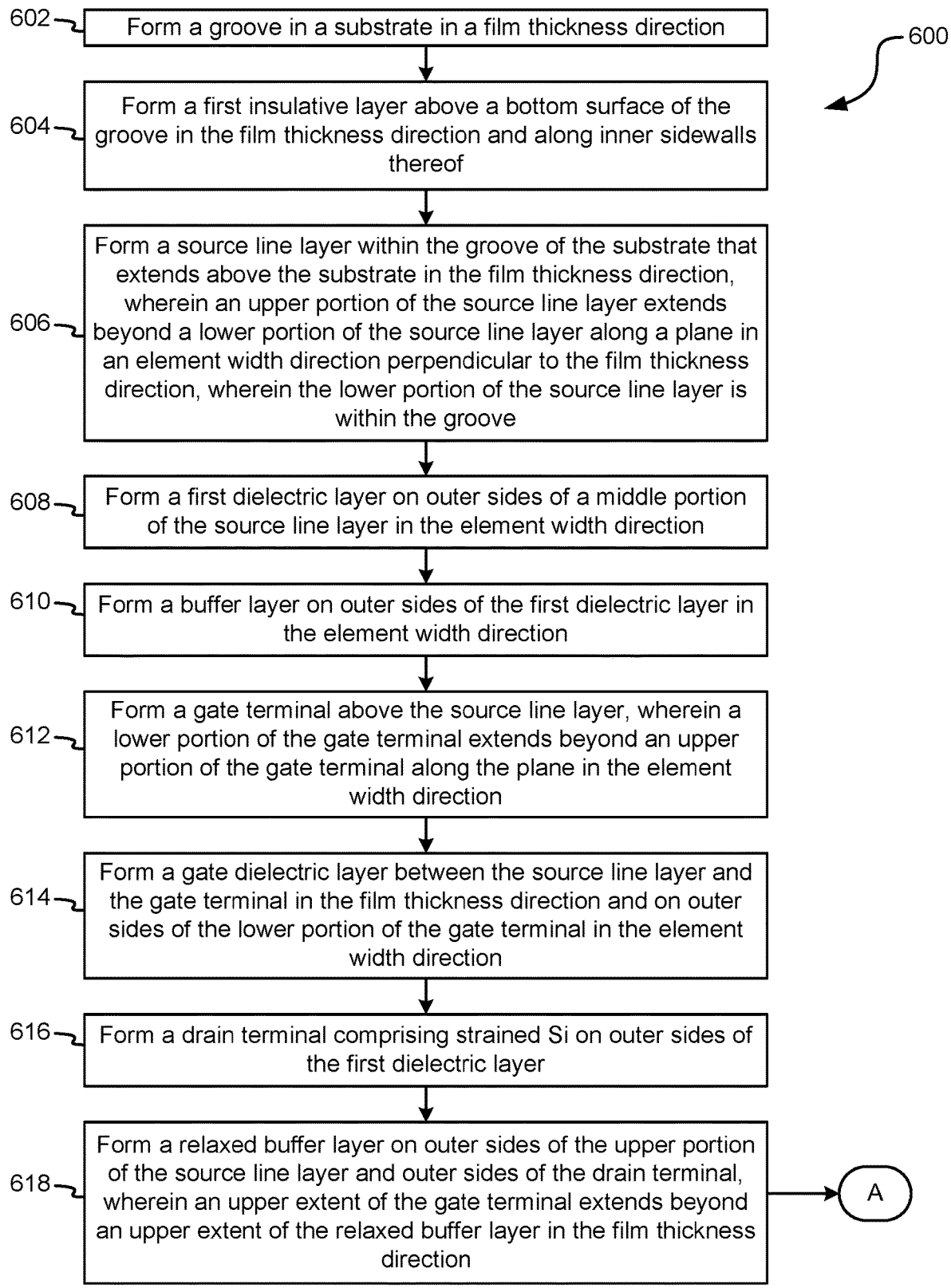
FIGS. 6A-6B show a flowchart of a method, in accordance with one embodiment.
Figure 6B:
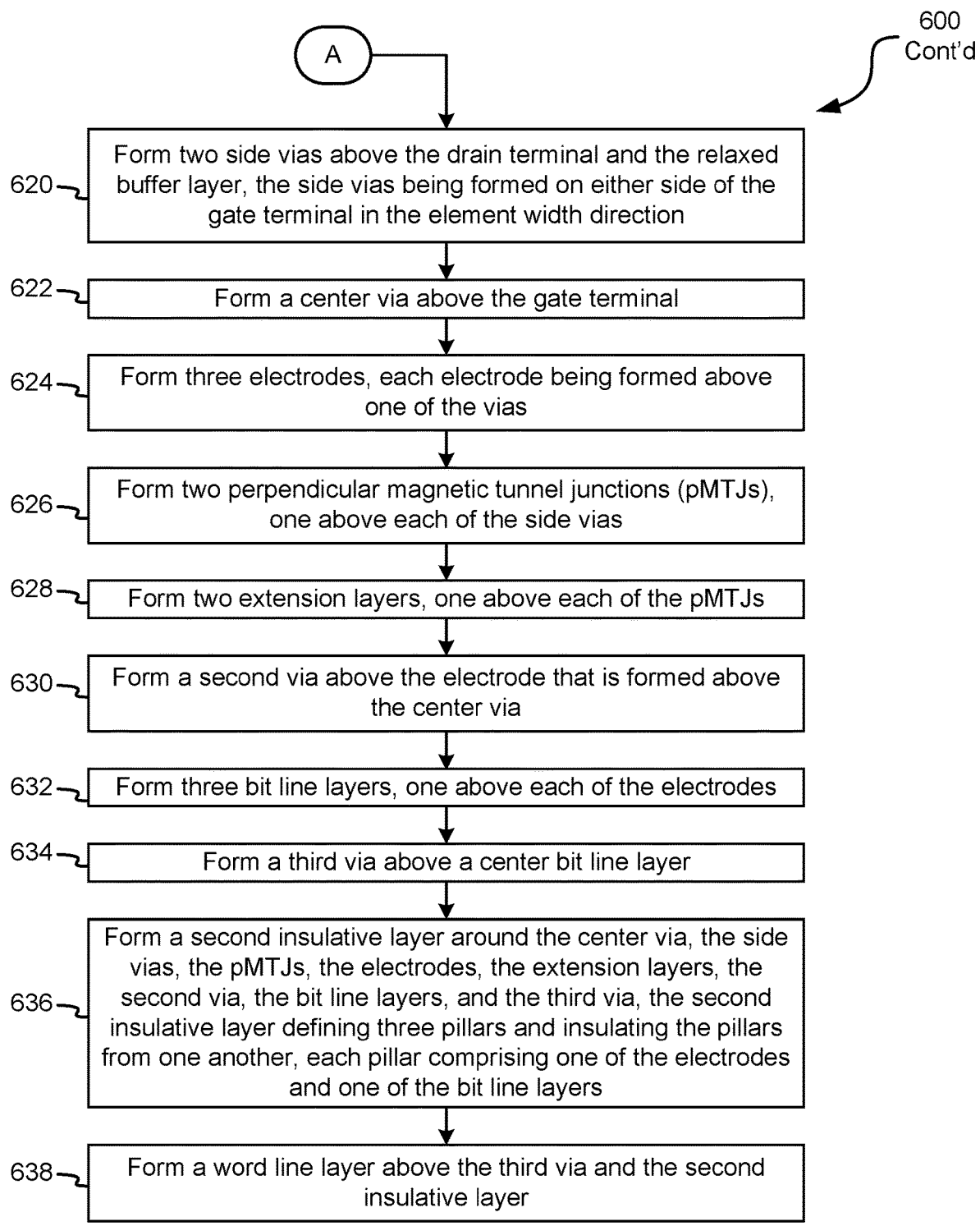

Now referring to FIGS. 6A-6B, a method 600 is shown according to one embodiment. The method 600 may be performed in accordance with the present invention in any of the environments depicted in FIGS. 1-5CC, among others not specifically described, in various approaches. Of course, more or less operations than those specifically described in FIGS. 6A-6B may be included in method 600, as would be understood by one of skill in the art upon reading the present descriptions.

Each of the operations of method 600 may be performed by any suitable component of the operating environment. For example, in various embodiments, method 600 may be partially or entirely performed by a machine, controller, processing circuit, or some other device or combination of devices suitable for manufacturing and/or processing a thin film structure. A processing circuit may include one or more processors, chips, and/or modules implemented in hardware and/or software, and preferably having at least one hardware component, and may be utilized in any device to perform one or more operations of method 600. Illustrative processing circuits include, but are not limited to, a CPU, an ASIC, a FPGA, etc., combinations thereof, or any other suitable computing device known in the art.

In the descriptions of method 600 in FIGS. 6A-6B, each layer may be formed using any known deposition process, such as sputtering, plating, CVD, pCVD, PVD, MBE, ALD, etc. Moreover, any descriptions of removal of layers and/or material may be performed using any material removal process of a type known in the art, such as planarization, CMP, recess etching, RIE, ion milling, plasma etching, photolithography, etc.

Referring now to FIG. 6A, method 600 may begin with operation 602. In operation 602, a groove is formed in a substrate in a film thickness direction. In operation 604, a first insulative layer is formed above a bottom surface of the groove in the film thickness direction and along inner sidewalls thereof. In operation 606, a source line layer is formed within the groove of the substrate that extends above the substrate in the film thickness direction. An upper portion of the source line layer extends beyond a lower portion of the source line layer along a plane in an element width direction perpendicular to the film thickness direction. Also, the lower portion of the source line layer is within the groove.

In operation 608, a first dielectric layer is formed on outer sides of a middle portion of the source line layer in the element width direction. In operation 610, a buffer layer is formed on outer sides of the first dielectric layer in the element width direction. In operation 612, a gate terminal is formed above the source line layer. A lower portion of the gate terminal extends beyond an upper portion of the gate terminal along the plane in the element width direction.

In operation 614, a gate dielectric layer is formed between the source line layer and the gate terminal in the film thickness direction and on outer sides of the lower portion of the gate terminal in the element width direction. In operation 616, a drain terminal that includes strained Si (such as vertically-strained Si) is formed on outer sides of the first dielectric layer. In operation 618, a relaxed buffer layer is formed on outer sides of the upper portion of the source line layer and outer sides of the drain terminal. An upper extent of the gate terminal extends beyond an upper extent of the relaxed buffer layer in the film thickness direction.

With reference to FIG. 6B, method 600 continues in operation 620, where two side vias are formed above the drain terminal and the relaxed buffer layer, the side vias being formed on either side of the gate terminal in the element width direction. In operation 622, a center via is formed above the gate terminal. In operation 624, three electrodes are formed, each electrode being formed above one of the vias. In operation 626, two pMTJs are formed, one above each of the side vias. In operation 628, two extension layers are formed, one above each of the pMTJs. In operation 630, a second via is formed above the electrode that is formed above the center via.

Then, in operation 632, three bit line layers are formed, one above each of the electrodes. In operation 634, a third via is formed above a center bit line layer. In operation 636, a second insulative layer is formed around the center via, the side vias, the pMTJs, the electrodes, the extension layers, the second via, the bit line layers, and the third via, the second insulative layer defining three pillars and insulating the pillars from one another, each pillar including one of the electrodes and one of the bit line layers.

Thereafter, in operation 638, a word line layer is formed above the third via and the second insulative layer.

In various embodiments of method 600 shown in FIGS. 6A-6B, the substrate may comprise Si, the first insulative layer, the second insulative layer, the first dielectric layer, and the gate dielectric layer may comprise a dielectric, such as $SiO_2$, SiON, $ZrO_2$, $HfO_2$, $Al_2O_3$, etc., the source line layer may comprise Si doped with B, the buffer layer may comprise SiGe, the relaxed buffer layer may comprise relaxed SiGe which exhibits a TDD in a range from about $10^3$ $cm^{-2}$ to about $10^5$ $cm^{-2}$, and the drain terminal may comprise strained Si comprising at least one material selected from a group consisting of: Si—Fe and Ge—F. In even more embodiments, the gate terminal may comprise Si doped with P, Si doped with Ar, Si doped with Be, Si doped with Mg, Si doped with Ca, Si doped with Sr, Si doped with Ba, Si doped with Ra, doped polysilicon, W, TaN, TiNi, TiN, Au, Ag, Cu, etc. Moreover, the vias, electrodes, bit line layers, and word line layer may comprise W, TaN, TiNi, TiN, Au, Ag, Cu, etc.

In one embodiment, each of the vias has a substantially cylindrical shape, which is imparted thereon by a shape of a mask used to form the channel(s) in which the vias are deposited.

In another embodiment, forming each of the pMTJs may include forming a seed layer above a corresponding electrode in the film thickness direction, forming an underlayer above the seed layer in the film thickness direction, forming a SAF seed layer above the underlayer in the film thickness direction, forming a first SAF layer above the SAF seed layer in the film thickness direction, forming a spacer layer above the first SAF layer in the film thickness direction, forming an AFM coupling layer above the spacer layer in the film thickness direction, forming a second SAF layer above the AFM coupling layer in the film thickness direction, forming a FM coupling layer above the second SAF layer in the film thickness direction, forming a reference layer above the FM coupling layer in the film thickness direction, forming a barrier layer above the reference layer in the film thickness direction, forming a free layer above the barrier layer in the film thickness direction, and forming at least one cap layer above the free layer in the film thickness direction.

In accordance with another embodiment, forming the drain terminal may comprise forming an oxide pad above exposed portions of the source line layer prior to forming the second insulative layer, removing a portion of the relaxed buffer on an inner side thereof in the element width direction, breaking bonds of relaxed SiGe within the relaxed buffer layer to form volatile $SiF_x$ and $GeF_y$, introducing pure $CF_4$ etchant gas to exposed sidewalls of the relaxed buffer layer, and growing strained vertical Si from the exposed sidewalls of the relaxed buffer layer to form the drain terminal.

In yet another embodiment, forming the gate terminal may comprise growing an oxide on inner sides of the drain terminal to form an upper portion of the gate dielectric layer. The gate dielectric layer has a cross-sectional U-shape, and the upper portion of the gate dielectric layer are the vertical elements of the U-shape. Forming the gate terminal may also include depositing a material for the gate terminal in a depression formed by the gate dielectric layer and insulative layers positioned above the relaxed buffer layer, removing portions of the deposited material to form a cross-sectional T-shape, and removing portions of the gate dielectric layer to expose an upper portion of the drain terminal. A lower portion of the gate terminal may have a thickness in the film thickness direction that is less than a thickness of the drain terminal in the film thickness direction, the lower portion of the gate terminal being a horizontal element of the T-shape. In addition, the second insulative layer may be formed above the gate terminal and the relaxed buffer layer.

According to one embodiment, at least a portion of the source line layer may be formed using a nitride pad positioned above the relaxed buffer layer.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:
1. A method, comprising:
   forming a groove in a substrate in a film thickness direction;
   forming a first insulative layer above a bottom surface of the groove in the film thickness direction and along inner sidewalls thereof;
   forming a first portion of a source line layer within the groove of the substrate;
   depositing a buffer layer on the substrate and the first portion of the source line layer;
   depositing a relaxed buffer layer on the buffer layer;
   etching the buffer layer and relaxed buffer layer to form an inner side of the buffer layer and an inner side of the relaxed buffer layer, the inner sides of the buffer layer and relaxed buffer layer being laterally outside of the trench in the element width direction;

forming a first dielectric layer on the inner side of the buffer layer;

forming a second portion of the source line layer, the second portion contacting the first portion and contacting the first dielectric layer and extending out of the trench formed in the substrate;

forming a drain terminal on the inner side of the buffer layer;

forming a gate dielectric layer on an inner side of the drain terminal; and forming a gate terminal above the source line layer, wherein a lower portion of the gate terminal extends beyond an upper portion of the gate terminal along the plane in the element width direction;

wherein an upper extent of the gate terminal extends beyond an upper extent of the relaxed buffer layer in the film thickness direction.

2. The method as recited in claim 1, further comprising:

forming two side vias above the drain terminal and the relaxed buffer layer, the side vias being formed on either side of the gate terminal in the element width direction;

forming a center via above the gate terminal;

forming three electrodes, each electrode being formed above one of the vias;

forming two perpendicular magnetic tunnel junctions (pMTJs), one above each of the side vias;

forming two extension layers, one above each of the pMTJs;

forming a second via above the electrode that is formed above the center via;

forming three bit line layers, one above each of the electrodes;

forming a third via above a center bit line layer;

forming a second insulative layer around the center via, the side vias, the pMTJs, the electrodes, the extension layers, the second via, the bit line layers, and the third via, the second insulative layer defining three pillars and insulating the pillars from one another, each pillar comprising one of the electrodes and one of the bit line layers; and forming a word line layer above the third via and the second insulative layer.

3. The method as recited in claim 2, wherein each via comprises at least one material selected from a group consisting of: W, TaN, TiNi, TiN, Au, Ag, and Cu, wherein the electrodes comprise at least one material selected from a group consisting of: W, TaN, TiNi, TiN, Au, Ag, and Cu, wherein the bit line layer comprises at least one material selected from a group consisting of: W, TaN, TiNi, TiN, Au, Ag, and Cu, and wherein the word line layer comprises at least one material selected from a group consisting of: W, TaN, TiNi, TiN, Au, Ag, and Cu.

4. The method as recited in claim 2, wherein the buffer layer comprises relaxed SiGe, and wherein forming the drain terminal comprises:

forming an oxide pad above exposed portions of the source line layer prior to forming the second insulative layer;

removing a portion of the relaxed buffer on an inner side thereof in the element width direction;

breaking bonds of relaxed SiGe within the relaxed buffer layer to form volatile $SiF_x$ and $GeF_y$;

introducing pure $CF_4$ etchant gas to expose sidewalls of the relaxed buffer layer; and growing the strained Si in a vertical orientation from the exposed sidewalls of the relaxed buffer layer to form the drain terminal.

5. The method as recited in claim 2, wherein forming the gate terminal comprises:

growing an oxide on inner sides of the drain terminal to form an upper portion of the gate dielectric layer, wherein the gate dielectric layer has a cross-sectional U-shape, the upper portion of the gate dielectric layer being vertical elements of the U-shape;

depositing a material for the gate terminal in a depression formed by the gate dielectric layer and insulative layers positioned above the relaxed buffer layer;

removing portions of the deposited material to form a cross-sectional T-shape;

removing portions of the gate dielectric layer to expose an upper portion of the drain terminal, wherein a lower portion of the gate terminal has a thickness in the film thickness direction that is less than a thickness of the drain terminal in the film thickness direction, the lower portion of the gate terminal being a horizontal element of the T-shape; and forming the second insulative layer above the gate terminal and the relaxed buffer layer.

6. The method as recited in claim 1, wherein each of the vias has a substantially cylindrical shape.

7. The method as recited in claim 1, wherein the substrate comprises Si, wherein the first insulative layer, the first dielectric layer, and the gate dielectric layer comprises at least one material selected from a group consisting of: $SiO_2$, SiON, $ZrO_2$, $HfO_2$, and $Al_2O_3$, wherein the source line layer comprises Si doped with B, wherein the buffer layer comprises SiGe, wherein the relaxed buffer layer comprises relaxed SiGe which exhibits a threading dislocation density (TDD) in a range from about $10^3$ cm$^{-2}$ to about $10^5$ cm$^{-2}$, wherein the drain terminal comprises strained Si comprising at least one material selected from a group consisting of: Si—Fe and Ge—F, and wherein the gate terminal comprises at least one material selected from a group consisting of: Si doped with P, Si doped with Ar, Si doped with Be, Si doped with Mg, Si doped with Ca, Si doped with Sr, Si doped with Ba, Si doped with Ra, doped polysilicon, W, TaN, TiNi, TiN, Au, Ag, and Cu.

8. The method as recited in claim 2, wherein forming of the pMTJ comprises:

forming a seed layer above a corresponding electrode in the film thickness direction;

forming an underlayer above the seed layer in the film thickness direction;

forming a synthetic antiferromagnetic (SAF) seed layer above the underlayer in the film thickness direction;

forming a first SAF layer above the SAF seed layer in the film thickness direction;

forming a spacer layer above the first SAF layer in the film thickness direction;

forming an antiferromagnetic (AFM) coupling layer above the spacer layer in the film thickness direction;

forming a second SAF layer above the AFM coupling layer in the film thickness direction;

forming a ferromagnetic (FM) coupling layer above the second SAF layer in the film thickness direction;
forming a reference layer;
forming a barrier layer above the reference layer in the film thickness direction; and
forming a free layer above the barrier layer in the film thickness direction.

9. The method as recited in claim 1, wherein at least a portion of the source line layer is formed using a nitride pad positioned above the relaxed buffer layer.

10. A method, comprising:
forming a groove in a substrate in a film thickness direction;
forming a first insulative layer above a bottom surface of the groove in the film thickness direction and along inner sidewalls thereof;
forming a first portion of a source line layer within the groove of the substrate;
depositing a buffer layer on the substrate and the first portion of the source line layer;
depositing a relaxed buffer layer on the buffer layer;
etching the buffer layer and relaxed buffer layer to form an inner side of the buffer layer and an inner side of the relaxed buffer layer, the inner sides of the buffer layer and relaxed buffer layer being laterally outside of the trench in the element width direction;
forming a first dielectric layer on the inner side of the buffer layer;
forming a second portion of the source line layer, the second portion contacting the first portion and contacting the first dielectric layer and extending out of the trench formed in the substrate
forming a drain terminal comprising strained Si on an inner side of the buffer layer;
forming a gate dielectric layer on an inner side of the drain terminal
forming a gate terminal above the second portion of the source line layer, wherein a lower portion of the gate terminal extends beyond an upper portion of the gate terminal along the plane in the element width direction and wherein the lower portion of the gate terminal is separated from the drain terminal by the gate dielectric layer;
wherein an upper extent of the gate terminal extends beyond an upper extent of the relaxed buffer layer in the film thickness direction;
forming two side vias above the drain terminal and the relaxed buffer layer, the side vias being formed on either side of the gate terminal in the element width direction;
forming a center via above the gate terminal;
forming three electrodes, each electrode being formed above one of the vias;
forming two perpendicular magnetic tunnel junctions (pMTJs), one above each of the side vias;
forming two extension layers, one above each of the pMTJs;
forming a second via above the electrode that is formed above the center via;
forming three bit line layers, one above each of the electrodes;
forming a third via above a center bit line layer;
forming a second insulative layer around the center via, the side vias, the pMTJs, the electrodes, the extension layers, the second via, the bit line layers, and the third via, the second insulative layer defining three pillars and insulating the pillars from one another, each pillar comprising one of the electrodes and one of the bit line layers; and
forming a word line layer above the third via and the second insulative layer.

11. The method as recited in claim 10,
wherein the substrate comprises Si,
wherein the first insulative layer, the second insulative layer, the first dielectric layer, and the gate dielectric layer comprises at least one material selected from a group consisting of: $SiO_2$, SiON, $ZrO_2$, $HfO_2$, and $Al_2O_3$,
wherein the source line layer comprises Si doped with B,
wherein the buffer layer comprises SiGe,
wherein the relaxed buffer layer comprises relaxed SiGe which exhibits a threading dislocation density (TDD) in a range from about $10^3$ cm$^{-2}$ to about $10^5$ cm$^{-2}$,
wherein the drain terminal comprises strained Si comprising at least one material selected from a group consisting of: Si—Fe and Ge—F,
wherein the gate terminal comprises at least one material selected from a group consisting of: Si doped with P, Si doped with Ar, Si doped with Be, Si doped with Mg, Si doped with Ca, Si doped with Sr, Si doped with Ba, Si doped with Ra, doped polysilicon, W, TaN, TiNi, TiN, Au, Ag, and Cu,
wherein each via comprises at least one material selected from a group consisting of: W, TaN, TiNi, TiN, Au, Ag, and Cu,
wherein the electrodes comprise at least one material selected from a group consisting of: W, TaN, TiNi, TiN, Au, Ag, and Cu,
wherein the bit line layer comprises at least one material selected from a group consisting of: W, TaN, TiNi, TiN, Au, Ag, and Cu, and
wherein the word line layer comprises at least one material selected from a group consisting of: W, TaN, TiNi, TiN, Au, Ag, and Cu.

12. The method as recited in claim 10, wherein each of the vias has a substantially cylindrical shape.

13. The method as recited in claim 10, wherein forming each of the pMTJs comprises:
forming a seed layer above a corresponding electrode in the film thickness direction;
forming an underlayer above the seed layer in the film thickness direction;
forming a synthetic antiferromagnetic (SAF) seed layer above the underlayer in the film thickness direction;
forming a first SAF layer above the SAF seed layer in the film thickness direction;
forming a spacer layer above the first SAF layer in the film thickness direction;
forming an antiferromagnetic (AFM) coupling layer above the spacer layer in the film thickness direction;
forming a second SAF layer above the AFM coupling layer in the film thickness direction;
forming a ferromagnetic (FM) coupling layer above the second SAF layer in the film thickness direction;
forming a reference layer above the FM coupling layer in the film thickness direction;
forming a barrier layer above the reference layer in the film thickness direction;
forming a free layer above the barrier layer in the film thickness direction; and
forming at least one cap layer above the free layer in the film thickness direction.

14. The method as recited in claim 10, wherein forming the drain terminal comprises:
- forming an oxide pad above exposed portions of the source line layer prior to forming the second insulative layer;
- removing a portion of the relaxed buffer on an inner side thereof in the element width direction;
- breaking bonds of relaxed SiGe within the relaxed buffer layer to form volatile $SiF_x$ and $GeF_y$;
- introducing pure $CF_4$ etchant gas to exposed sidewalls of the relaxed buffer layer; and
- growing strained vertical Si from the exposed sidewalls of the relaxed buffer layer to form the drain terminal.

15. The method as recited in claim 10, wherein forming the gate terminal comprises:
- growing an oxide on inner sides of the drain terminal to form an upper portion of the gate dielectric layer, wherein the gate dielectric layer has a cross-sectional U-shape, the upper portion of the gate dielectric layer being vertical elements of the U-shape;
- depositing a material for the gate terminal in a depression formed by the gate dielectric layer and insulative layers positioned above the relaxed buffer layer;
- removing portions of the deposited material to form a cross-sectional T-shape;
- removing portions of the gate dielectric layer to expose an upper portion of the drain terminal, wherein a lower portion of the gate terminal has a thickness in the film thickness direction that is less than a thickness of the drain terminal in the film thickness direction, the lower portion of the gate terminal being a horizontal element of the T-shape; and
- forming the second insulative layer above the gate terminal and the relaxed buffer layer.

16. The method as recited in claim 10, wherein at least a portion of the source line layer is formed using a nitride pad positioned above the relaxed buffer layer.

* * * * *